(12) United States Patent
Nishibayashi

(10) Patent No.: US 7,681,521 B2
(45) Date of Patent: Mar. 23, 2010

(54) INSULATION FILM FORMATION DEVICE

(75) Inventor: Takahiro Nishibayashi, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 479 days.

(21) Appl. No.: 10/533,932

(22) PCT Filed: Nov. 7, 2003

(86) PCT No.: PCT/JP03/14176

§ 371 (c)(1),
(2), (4) Date: May 4, 2005

(87) PCT Pub. No.: WO2004/047161

PCT Pub. Date: Jun. 3, 2004

(65) Prior Publication Data

US 2006/0011133 A1   Jan. 19, 2006

(30) Foreign Application Priority Data

Nov. 18, 2002  (JP) .............................. 2002-333927
Nov. 18, 2002  (JP) .............................. 2002-333928

(51) Int. Cl.
*H01L 21/306*  (2006.01)
*B05C 11/00*   (2006.01)
*B05B 13/00*   (2006.01)
*B05B 13/04*   (2006.01)

(52) U.S. Cl. .......................... 118/66; 118/712; 118/52; 118/58; 118/320; 118/630

(58) Field of Classification Search ................. 118/630, 118/719

See application file for complete search history.

(56) References Cited

U.S. PATENT DOCUMENTS

| 4,687,907 | A | * | 8/1987 | Barkley et al. | ............... | 392/473 |
| 4,999,215 | A | * | 3/1991 | Akagi et al. | ................. | 427/488 |
| 5,248,636 | A | * | 9/1993 | Davis et al. | .................. | 438/709 |
| 5,762,745 | A | | 6/1998 | Hirose | | |
| 5,844,662 | A | * | 12/1998 | Akimoto et al. | ................ | 355/27 |
| 5,964,954 | A | * | 10/1999 | Matsukawa et al. | ............ | 134/6 |

(Continued)

FOREIGN PATENT DOCUMENTS

JP   04-217353   *   8/1992

(Continued)

OTHER PUBLICATIONS

Machine translation of JP 2002-064044.*

(Continued)

*Primary Examiner*—Karla Moore
*Assistant Examiner*—Nathan K Ford
(74) *Attorney, Agent, or Firm*—Smith, Gambrell & Russell, LLP

(57) ABSTRACT

An SOD system (100A) comprises a process block (8) for performing a prescribed processing so as to form an insulating film on a wafer W, a carrier block (7) for transferring the wafer W from the outside into the process block (8), a sub-transfer mechanism (12) for transferring the substrate W between the process block (8) and the carrier block (7), and a main transfer mechanism (15). A process tower (T1) prepared by stacking one upon the other a plurality of process units for performing a series of processing for forming an insulating film on the wafer W is arranged detachable from the process block (8).

17 Claims, 26 Drawing Sheets

U.S. PATENT DOCUMENTS

| | | | |
|---|---|---|---|
| 6,071,047 A * | 6/2000 | Nakai | 409/131 |
| 6,192,291 B1 * | 2/2001 | Kwon | 700/121 |
| 6,309,116 B1 * | 10/2001 | Mahara et al. | 396/611 |
| 6,350,316 B1 * | 2/2002 | Hayashi et al. | 118/52 |
| 2001/0015412 A1 * | 8/2001 | Komori et al. | 250/492.3 |
| 2002/0037462 A1 | 3/2002 | Ogata et al. | |

FOREIGN PATENT DOCUMENTS

| | | |
|---|---|---|
| JP | 09-129526 | 5/1997 |
| JP | 2000-138213 | 5/2000 |
| JP | 2002-064044 | 2/2002 |
| JP | 2002-329717 | 11/2002 |
| JP | 2003-100621 | 4/2003 |

OTHER PUBLICATIONS

Translated abstract of JP 04-217353.*

JP 2002-064044; Feb. 28, 2002; Masao, Tsuji. (Machine Translation).*

JP 04-217353; Aug. 1992; Kuwabara et al. (Translated abstract).*

Semiconductor FPD World Zokango, "'02 Saishin Hando tai Process Gijutsu-Technology & Equipment", vol. 20, No. 15, pp. 188-189, Dec. 2001.

* cited by examiner

INSULATION FILM FORMATION DEVICE

TECHNICAL FIELD

The present invention relates to an insulating film-forming apparatus for forming an insulating film on a substrate such as a semiconductor wafer or an LCD substrate (a glass substrate for a liquid crystal display).

BACKGROUND ART

In the manufacturing process of a semiconductor device, an SOD (Spin on Dielectric) method is employed as one of the technologies for forming an insulating film (an interlayer insulating film) on a semiconductor wafer. In the SOD method, a coating film, i.e., a film formed by the coating method, is formed on a wafer by a spin coating method, followed by applying a chemical processing or a heat processing or the like to the coating film so as to form an insulating film. To be more specific, the surface of a wafer is coated first with a chemical liquid prepared by dispersing the material for forming the insulating film in a solvent, followed by evaporating the solvent from the coating film so as to dry the coating film. Then, a baking processing is applied to the dried coating film so as to cause a chemical reaction to be brought about by the heating. Finally, the coating film is heated for the curing purpose, thereby obtaining a desired insulating film. Incidentally, depending on the kind of the chemical liquid used, it is necessary to apply an additional processing such as the processing under an ammonia gas atmosphere or a chemical processing such as a solvent exchange processing.

An SOD system 400 shown in FIG. 35 and an SOD system 450 shown in FIG. 36 are known to the art as the SOD system for carrying out the processing described above.

In the SOD system 400 shown in FIG. 35, a carrier 410 housing, for example, 25 wafers is transferred into a carrier stage 411. The wafers within the carrier 410 are taken out by a delivery arm 412 and, then, transferred into a process zone 414 through the delivery section of a shelf unit 413a. A transfer mechanism 415 for transferring the wafer is arranged in the central portion of the process zone 414. Also, a plurality of shelf units, e.g., two shelf units 413b and 423c, and a plurality of coating units 416 for coating the wafer with a chemical liquid are arranged in the vicinity of the transfer mechanism 415. Each of the shelf units 413b and 413c noted above includes a plurality of process units such as heating units for applying a prescribed heat processing to the wafer. The transfer mechanism 415 serves to transfer the wafer into and out of these process units. Incidentally, the heating unit noted above includes, for example, a baking unit for performing a baking processing and a low temperature heating unit for applying a drying processing to the chemical liquid.

It should be noted that various kinds of chemical liquids are used in the SOD method and, thus, the process conditions of the SOD method are rendered slightly different in many cases depending on the kind of the chemical liquid used. For example, the heat processing under a low temperature is required, or it is necessary to carry out the processing under a different processing atmosphere. Such being the situation, it is necessary in some cases to change the specifications of the coating unit and the heating unit depending on the kind of the chemical liquid used. Also, even in the case of using the same chemical liquid, it is necessary in some cases to change the process conditions depending on the desired thickness of the film that is to be formed. In view of the variety of the chemical liquids described above, it is not advisable in terms of the cost and the footprint to newly prepare a system in accordance with the change in process.

Under the circumstances, vigorous research is being conducted by the present inventors in an attempt to develop an SOD system capable of coping with various processes. For example, disclosed in Japanese Patent Disclosure (Kokai) No. 2000-138213 is an SOD system in which a cooling unit, a coating unit, an aging unit, a solvent exchange unit, a curing unit, and a heating unit are arranged in the process section for applying a series of processing to a substrate.

In the SOD system disclosed in the Japanese patent document quoted above, the cooling unit, the aging unit, the curing unit, and the heating unit are stacked one upon the other so as to form a process unit group of a multi-stage structure. On the other hand, the coating unit and the solvent exchange unit are arranged separately from the process unit group.

However, if a plurality of process units are arranged in a dispersed fashion as in the SOD system quoted above, the footprint of the entire SOD system is increased. Also, the transfer efficiency of the wafer within the SOD system is rendered poor so as to lower the through-put. Further, a difficulty is generated in the SOD system quoted above in performing various automatic controls. It should be noted in this connection that the wafer is coated with a chemical liquid in the coating unit and a prescribed heat processing is applied to the coating film in the baking unit, followed by measuring the thickness of the coating film. If various automatic controls are to be performed on the basis of the measured data so as to change the process parameters in the coating unit and the baking unit and to generate an alarm when the thickness of the coating film exceeds a prescribed range, it is difficult to locate the process unit causing the inconvenience. It is also difficult to supervise the entire apparatus. Still further, where a certain process unit is in trouble, it is necessary to stop all the processing in the SOD system for coping with the process unit that is in trouble, with the result that the productivity is lowered.

The SOD system 450 shown in FIG. 36 is described in detail in Japanese Patent Disclosure No. 2003-100621. The SOD system 450 comprises a first process zone 460A. Also, a second process zone 460B and a carrier station 460C are arranged to have the first process zone 460A sandwiched therebetween.

The first process zone 460A includes a plurality of coating units 461 for coating a wafer with a chemical liquid so as to form a coating film. These coating units 461 are stacked one upon the other so as to form a multi-stage structure. In the coating unit 461, a chemical liquid is supplied from a nozzle onto substantially the center of rotation of a wafer held by a spin chuck. In accordance with rotation of the spin chuck, the chemical liquid supplied onto the wafer is spread on the wafer surface so as to form a coating film. The first process zone 460A also includes shelf units 462a and 462b. Each of these shelf units 462a and 462b is of a multi-stage structure including, for example, a temperature control unit for controlling the wafer at a prescribed temperature, a delivery unit, and a low temperature heating unit for heating the wafer having the coating film formed thereon so as to dry the coating film. The process units noted above are stacked one upon the other so as to form each of the shelf units 462a and 462b. The wafer is transferred into and out of each of these process units by a transfer mechanism 463.

The second process zone 460B includes two shelf units 464a and 464b of a heating system. In each of these shelf units 464a and 464b, a baking unit for baking the wafer after the drying processing at a higher temperature and a curing unit for further heating the baked wafer for curing the coating film are stacked one upon the other so as to form a multi-stage structure. The wafer is transferred into and out of the process unit included in each of these shelf units 464a and 464b by a transfer mechanism 465.

The carrier station 460C includes a table section 466 on which is disposed a carrier 470 housing a large number of wafers. The carrier station 460 also includes a delivery arm 467 for transferring the wafer between the carrier 470 and the first process zone 460A.

In the SOD system 450, the coating unit 461 and the temperature control unit are arranged in a process zone differing from that of the baking unit and the curing unit, as in the SOD system 400 shown in FIG. 35. In addition, the coating unit 461 and the temperature control unit are arranged in a dispersed fashion within the same process zone. It follows that the footprint is also increased in the SOD system 450. Also, since the process units are arranged in a dispersed fashion in the SOD system 450, the transfer efficiency of the wafer is made poor so as to lower the through-put.

Further, in the SOD system 450, the plural coating units 461 are stacked one upon the other within the same shelf unit so as to form a multi-stage structure. As a result, a drain pipe 469 for recovering the waste chemical liquid discharged from the coating units 461 includes a horizontal portion as schematically shown in FIG. 37. The waste chemical liquid discharged from the plural coating units 461 fails to flow smoothly within the horizontal portion of the drain pipe 469 and tends to stagnate within the horizontal portion. Since the chemical liquid used in the SOD system tends to be solidified, a serious problem is generated that the horizontal portion of the drain pipe 469 is plugged with the waste chemical liquid.

It should also be noted that, since the coating units 461 are arranged side by side and stacked one upon the other, it is necessary to change the construction of the pipes such as the drain pipe 469 for each of the coating units 461. What should be noted in this connection is that the manufacturing process of the SOD system is made complex by the dispersion of the specification of the piping so as to give rise to the problem that the productivity is lowered.

It should also be noted that a chemical liquid tank for storing the chemical liquid is arranged in a region (not shown) different from the region in which the coating unit 461 is arranged, with the result that the supply path of the chemical liquid is prolonged. A cleaning processing is applied to the coating unit 461 after completion of the processing of a prescribed lot. Since the chemical liquid is not discharged from the nozzle during the cleaning processing of the coating unit 461, the cleaning processing is carried out under the state that the chemical liquid is left to remain within the supply path. When the processing of the succeeding lot is started, a dummy dispensing is carried out such that all the chemical liquid remaining inside the supply path is discharged from the supply nozzle. Therefore, it is necessary to discharge as a waste material a large amount of the chemical liquid remaining inside the supply path, leading to an increased process cost.

Further, in replacing the chemical liquid tank or in replacing, for example, the chemical liquid filter connected to the chemical liquid pipe, bubbles of the chemical liquid are generated within the pipe. Naturally, it is necessary to remove the bubbles before the coating operation for forming a coating film on the substrate surface. A large amount of the chemical liquid must be discarded during the operation for removing the bubbles, if the pipe is long.

DISCLOSURE OF THE INVENTION

A first object of the present invention, which has been achieved in view of the situation described above, is to provide an insulating film-forming apparatus, which permits diminishing the footprint and which also permits improving the transfer efficiency of the substrate. Also, a second object of the present invention is to provide an insulating film-forming apparatus that permits suppressing the waste of, for example, a chemical liquid.

According to the present invention, there is provided an insulating film-forming apparatus, comprising:

a substrate process section for applying a prescribed processing to a substrate for forming an insulating film on the substrate;

a substrate transfer section for transferring the substrate from the outside into the substrate process section; and a substrate transfer mechanism for transferring the substrate between the substrate process section and the substrate transfer section;

wherein:

the substrate process section includes a process tower housed in a housing and consisting of a plurality of process units, which are stacked one upon the other, for performing a series of processing for forming an insulating film on the substrate, said process tower including a coating unit for coating the substrate with a chemical liquid containing a material of the insulating film so as to form a coating film, and a heating unit for heating the substrate having the coating film formed thereon; and the process tower is detachable from the substrate process section.

In the insulating film-forming apparatus of the present invention pointed out above, it is desirable for the process tower to have a frame of a prescribed shape. It is also desirable for the plural process units included in the process tower to be detachable from the frame of the process tower.

In the insulating film-forming apparatus of the present invention, a plurality of process units required for forming an insulating film are arranged within a single process tower so as to make it possible to decrease the footprint of the insulating film-forming apparatus. Also, the transferring distance of the substrate can be shortened, and the substrate can be transferred efficiently so as to achieve a high through-put. Further, the construction of the process unit arranged within the process tower can be appropriately changed easily in accordance with the object, and the process tower itself can be replaced easily by another process tower in accordance with, for example, the change in the chemical liquid that is used. As a result, the maintenance of the process unit arranged within the process tower and the maintenance of the entire process tower can be performed easily.

Also, in the insulating film-forming apparatus of the present invention, it is desirable to connect a unit control device included in each of the plural process units arranged within the process tower for controlling the processing of the substrate to a tower control apparatus for controlling a series of processing performed by the plural process units arranged within the process tower. In this case, it is desirable for the tower control apparatus to be constructed to recognize automatically the process unit connected to the tower control apparatus. When the insulating film-forming apparatus is constructed to be capable of automatically detecting the change in the construction of the process unit within the process tower, it is possible to apply the process control to the substrate in the entire insulating film-forming apparatus.

Further, it is desirable for the insulating film-forming apparatus of the present invention to include at least two substrate process sections that are constructed such that at least one substrate process section is detachable from the other substrate process section. In other words, it is desirable to construct the insulating film-forming apparatus such that an additional substrate process section can be arranged in addition to a single substrate process section that was arranged initially. In this case, it is possible to increase the process capacity of the insulating film-forming apparatus while suppressing the increase in the footprint of the insulating film-forming apparatus as much as possible.

Further, it is desirable for the coating unit to have a two-stage structure of a coating process section formed in the upper stage and a waste liquid recovery section formed in the lower stage. In this case, it is desirable to arrange in the coating process section a substrate holding mechanism for holding the substrate substantially flat, a chemical liquid supply nozzle for supplying a chemical liquid to the substrate held by the substrate holding mechanism, and a cup surrounding the side surfaces of the substrate held by the substrate holding mechanism and equipped with a chemical liquid discharge port formed in the bottom. It is also desirable to arrange in the waste liquid recovery section a waste liquid tank storing the waste liquid discharged from the discharge port formed in the cup and a waste liquid passageway section, which does not include a horizontal portion and which serves to guide the waste liquid discharged from the discharge port formed in the cup into the waste liquid tank. In this case, the chemical liquid supply passageway and the waste liquid passageway in the coating unit can be made optimum so as to prevent the plugging of the waste liquid passageway. Further, it is desirable to arrange a chemical liquid tank for storing the chemical liquid used in the coating process section in the waste liquid recovery section, and to arrange a pump for supplying the chemical liquid from the chemical liquid tank into the chemical liquid supply nozzle in the coating process section. In this case, the liquid supply pipe leading to the chemical liquid supply nozzle can be shortened so as to suppress the waste of the coating liquid.

BEST MODE FOR CARRYING OUT THE INVENTION

An embodiment of the present invention will now be described with reference to the accompanying drawings.

Figure 1:
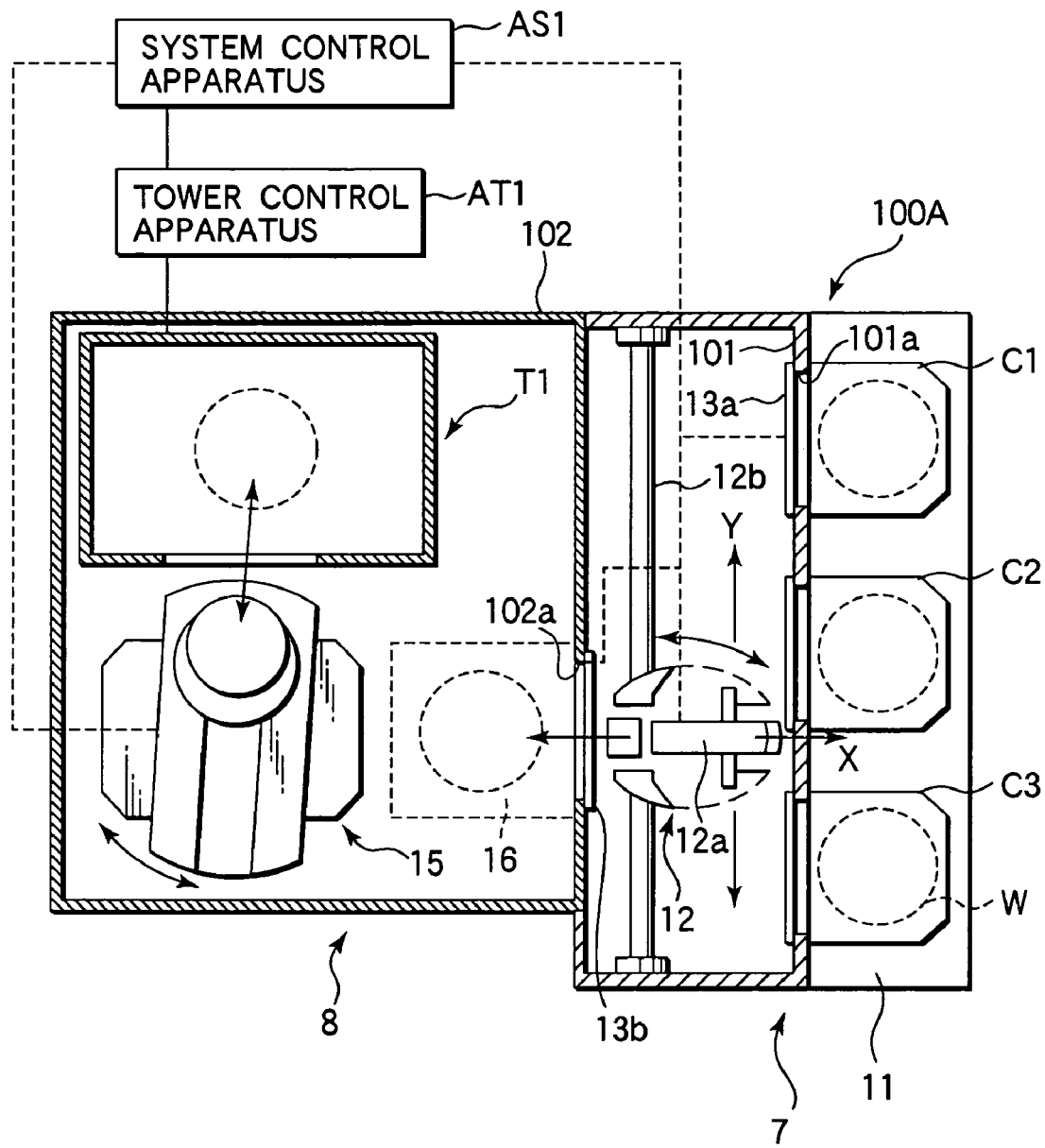
FIG. 1 is a horizontal cross sectional view schematically showing the construction of an SOD system.
Figure 2:
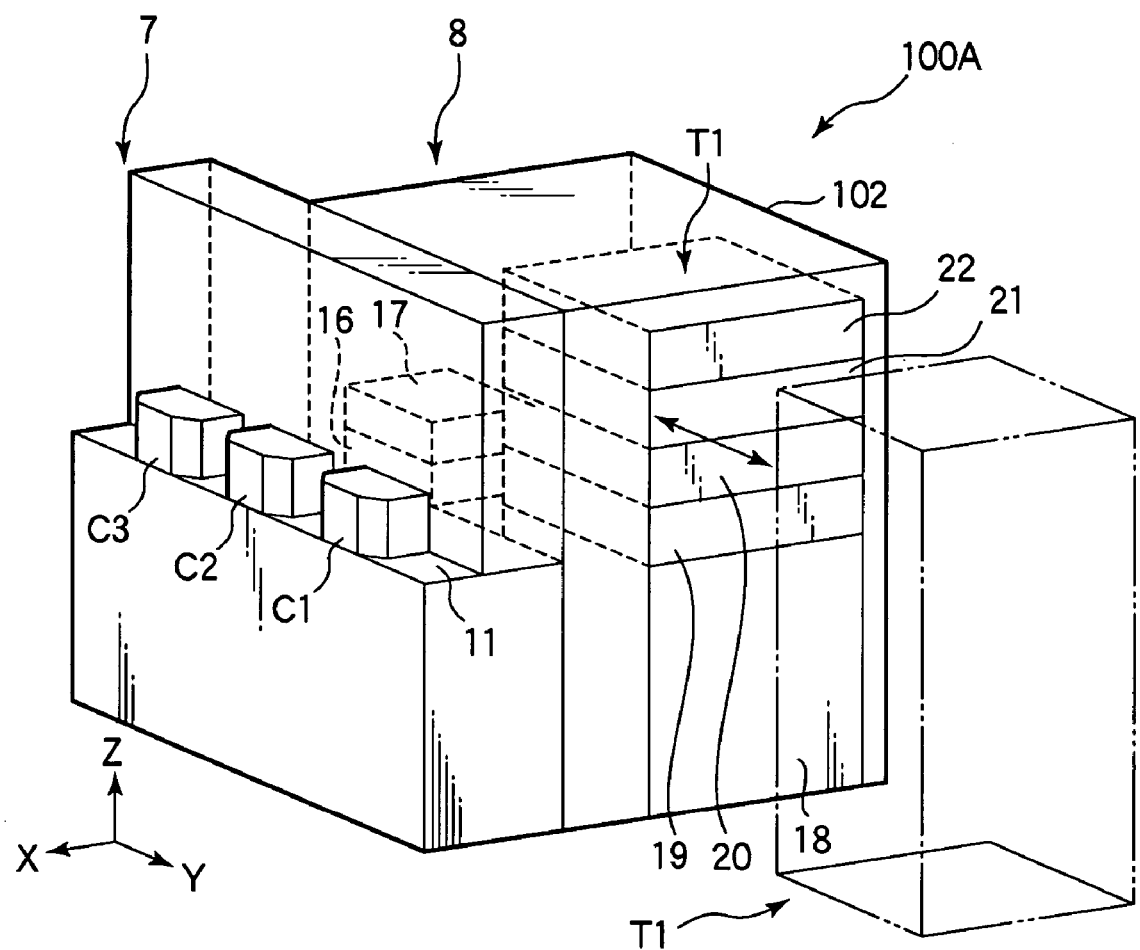
FIG. 2 is an oblique view schematically showing the construction of the SOD system shown in FIG. 1.
Figure 3:
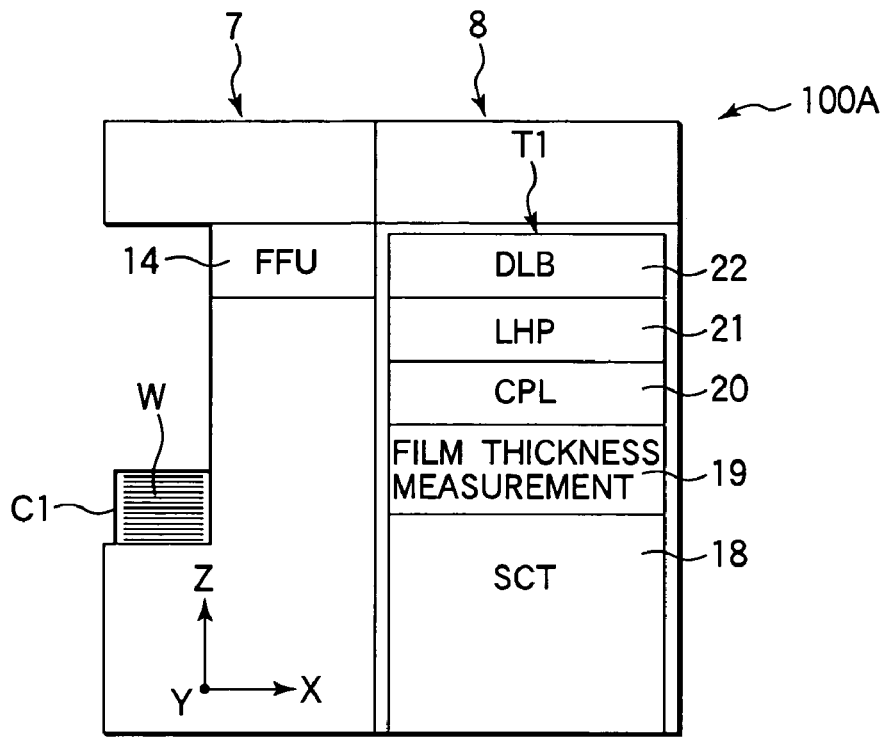
FIG. 3 is a side view schematically showing the construction of the SOD system shown in FIG. 1.

FIG. 1 is a horizontal cross sectional view schematically showing the construction of an SOD system 100A for forming an insulating film by an SOD method, and FIGS. 2 and 3 are an oblique view and a side view, respectively, each showing the construction of the SOD system 100A shown in FIG. 1.

The SOD system 100A comprises a process block 8 for applying a prescribed processing to a wafer W and a carrier block 7 for transferring the wafer W between a carrier C housing a prescribed number of wafers W and the process block 8.

The carrier block 7 includes a carrier table 11 on which a plurality of carriers, e.g., three carriers C1 to C3, can be disposed and a sub-transfer mechanism 12 for transferring the wafer W between the carriers C1 to C3 disposed on the carrier table 11 and the process block 8. The sub-transfer mechanism 12 is arranged within a housing 101.

A plurality of wafers, e.g., 25 wafers W, can be housed in each of the carriers C1 to C3 such that these wafers W assume a substantially horizontal posture and are positioned a prescribed distance apart from each other in the vertical direction (Z-direction) within each of these carriers C1 to C3. A wafer transfer port 101a that can be opened or closed by a shutter 13a is formed in the wall of the housing 101 on the side of the carrier table 11.

The sub-transfer mechanism 12 includes a transfer pick 12a movable in the X-direction and the Y-direction so as to permit the wafer W to be taken out from within the carriers C1 to C3 for delivery into the process block 8 or, by contraries, to permit the wafer W to be taken out from within the process block 8 so as to be housed in the carriers C1 to C3. Also, the transfer pick 12a is rotatable within an XY plane (horizontal plane), movable in the Z-direction, and movable in the Y-direction along a guide rail 12b.

A fan filter unit (FFU) 14 is arranged in an upper portion of the housing 101 such that a clean air is supplied from the fan filter unit (FFU) 14 into the housing 101 in a manner to form a down flow. As a result, the attachment of particles to the wafer W is suppressed.

The process block 8 includes a process tower T1 for applying a prescribed processing to the wafer W so as to form an insulating film on the wafer W, a delivery unit (TRS) 16 for transferring the wafer W between the process tower T1 and the carrier block 7, a UV irradiating unit (DVT) 17 arranged in the upper stage of the delivery unit (TRS) 16 for applying an UV irradiating processing to the surface of the wafer W, and a main transfer mechanism 15 for transferring the wafer W within the process block 8. These members of the process block 8 are arranged within a housing 102.

A wafer transfer port 102a that can be opened or closed by a shutter 13b is formed in that portion of the wall of the housing 102 on the side of the carrier block 7 which is positioned to face the delivery unit (TRS) 16. Also, a fan filter unit (FFU), not shown, is arranged in an upper portion of the housing 102 so as to supply a clean air into the housing 102 in a manner to form a down flow.

A plurality of process units for performing a series of processing for forming an insulating film on the wafer W by the SOD method are stacked one upon the other so as to form the process tower T1. In the present invention, the series of processing performed in the process tower T1 is defined to include the processing that handles a chemical liquid and the waste thereof, and the processing that handles the waste gas containing the component evaporated from the coating film formed on the wafer W. Therefore, the process tower T1 includes a temperature control unit (CPL) 20 for controlling the wafer at a prescribed temperature before the coating step with the chemical liquid containing the material used for forming the insulating film, a coating unit (SCT) 18 for coating the wafer surface with the chemical liquid so as to form the coating film, a low temperature heating unit (LHP) 21 for thermally evaporating the solvent contained in the coating film formed on the wafer surface so as to dry the coating film, and a baking unit (DLB) 22 for heating the wafer W so as to make progress the chemical reaction of the coating film.

Further, a film thickness measuring unit 19 for measuring the thickness of the insulating film is also included in the process tower T1, though it is not absolutely necessary for the film thickness measuring unit 19 to be included in the process tower T1.

In the SOD system 100A, a plurality of process units for performing a series of processing are concentrated in the process tower T1 so as to make it possible to suppress an increase in the footprint of the process block 8 as much as possible. As a result, the clean room in which the SOD system is arranged and the fan filter unit (FFU) arranged in the upper portion of the process block 8 can also be miniaturized so as to lessen the burden in the manufacturing cost.

Also, in the process tower T1, the temperature control unit (CPL) 20, the low temperature heating unit (LHP) 21, and the baking unit (DLB) 22 are successively stacked one upon the other in the order mentioned on the upper side of the film thickness measuring unit 19 so as to form a heat processing area in which a prescribed heat processing is applied to the wafer W. On the other hand, a coating process area comprising the coating unit (SCT) 18 for forming a coating film on the wafer W is formed on the lower side of the film thickness measuring unit 19. Since the process tower T1 is constructed such that the diffusion of heat from the heating process area into the coating process area is suppressed by the film thickness measuring unit 19, it is possible to suppress a nonuniformity in quality of the coating film, which is caused by the change in temperature, in the coating unit (SCT) 18. As a result, a coating film of a stable quality can be formed. Incidentally, the upper side of the baking unit (DLB) 22 is utilized as a space for housing, for example, a motor or another electric system, or as an exhaust area for housing, for example, an exhaust pipe.

Figure 4:
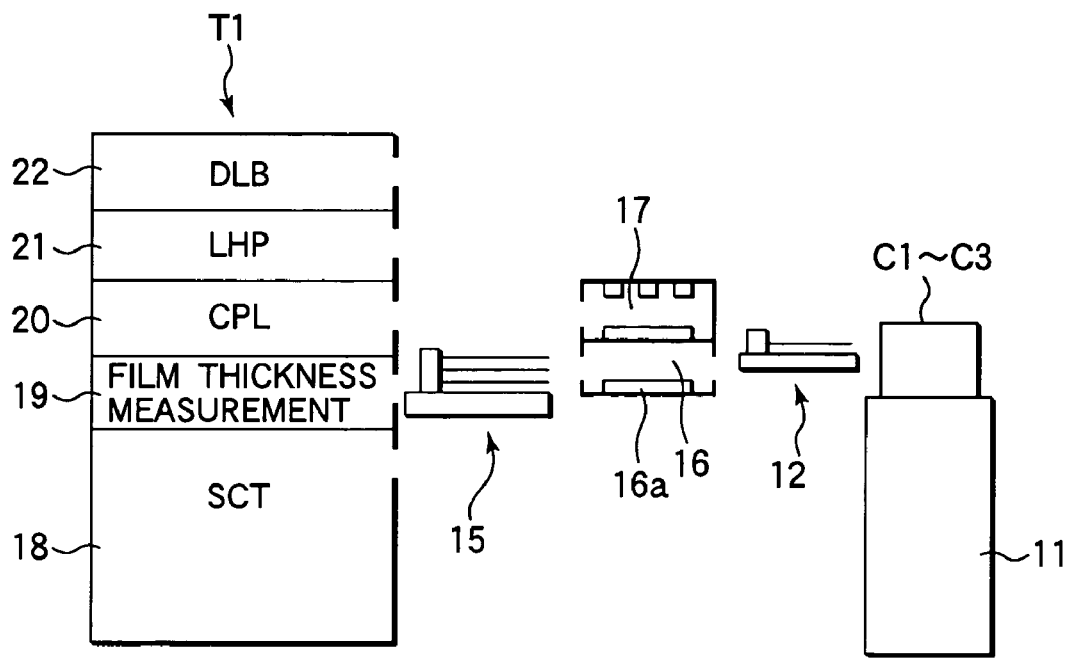
FIG. 4 schematically illustrates the transfer passageway of the wafer between the carrier and a process tower.

FIG. 4 schematically illustrates the transfer passageway of the wafer W between the carriers C1 to C3 disposed on the carrier table 11 and the process tower T1. In the drawing, the process tower T1 is shown on the left side of the main transfer mechanism 15 for simplifying the description. However, the process tower T1 is actually arranged rearward of the main transfer mechanism 15 on the paper as shown in FIG. 1.

The delivery unit (TRS) 16 includes a delivery stage 16a of the wafer W onto which the wafer can be delivered by each of the sub-transfer mechanism 12 and the main transfer mechanism 15. The wafer W transferred out of the carriers C1 to C3 by means of the sub-transfer mechanism 12 is disposed on the delivery stage 16a and, then, further transferred by the main transfer mechanism 15 from the delivery stage 16a. By contraries, the wafer W subjected to a prescribed processing in the process tower T1 is transferred by the main transfer mechanism 15 into the delivery unit (TRS) 16 and, then, further transferred from the delivery unit (TRS) 16 by the sub-transfer mechanism 12.

The UV irradiating unit (DVT) 17 is operated in the case where, for example, the wafer W is coated twice with the chemical liquid. To be more specific, the UV irradiating unit (DVT) 17 is operated to apply a UV irradiating processing to the wafer surface coated with a first lot of the chemical liquid, i.e., to the coating film of the chemical liquid formed first on the wafer surface, so as to improve the wettability of the substrate surface with the chemical liquid and, then, the substrate surface coated with the first of the chemical liquid is further coated with a second of the chemical liquid. The UV irradiating unit (DVT) 17 comprises a stage on which the wafer W is disposed and an UV lamp for irradiating the wafer W disposed on the stage with an ultraviolet light having a prescribed wavelength, though the detailed construction of the UV irradiating unit (DVT) 17 is not shown in the drawing.

Incidentally, it is possible to arrange the UV irradiating unit (DVT) 17 in the process tower T1.

The sub-transfer mechanism 12 is incapable of gaining access to any of the process tower T1 and the UV irradiating unit (DVT) 17, and the main transfer mechanism 15 alone is capable of gaining access to these apparatuses. In the SOD system 100A, the main transfer mechanism 15 alone is utilized for transferring the wafer W within the process block 8. As a result, the footprint of the process block 8 can be much suppressed. Also, since a plurality of process units for performing a series of processing are arranged in a concentrated fashion in the process tower T1, the total transfer distance of the wafer W can be shortened. As a result, the transfer efficiency of the wafer W is enhanced so as to improve the through-put of the transfer, leading to a high through-put of the entire SOD system 100A.

Figure 5:
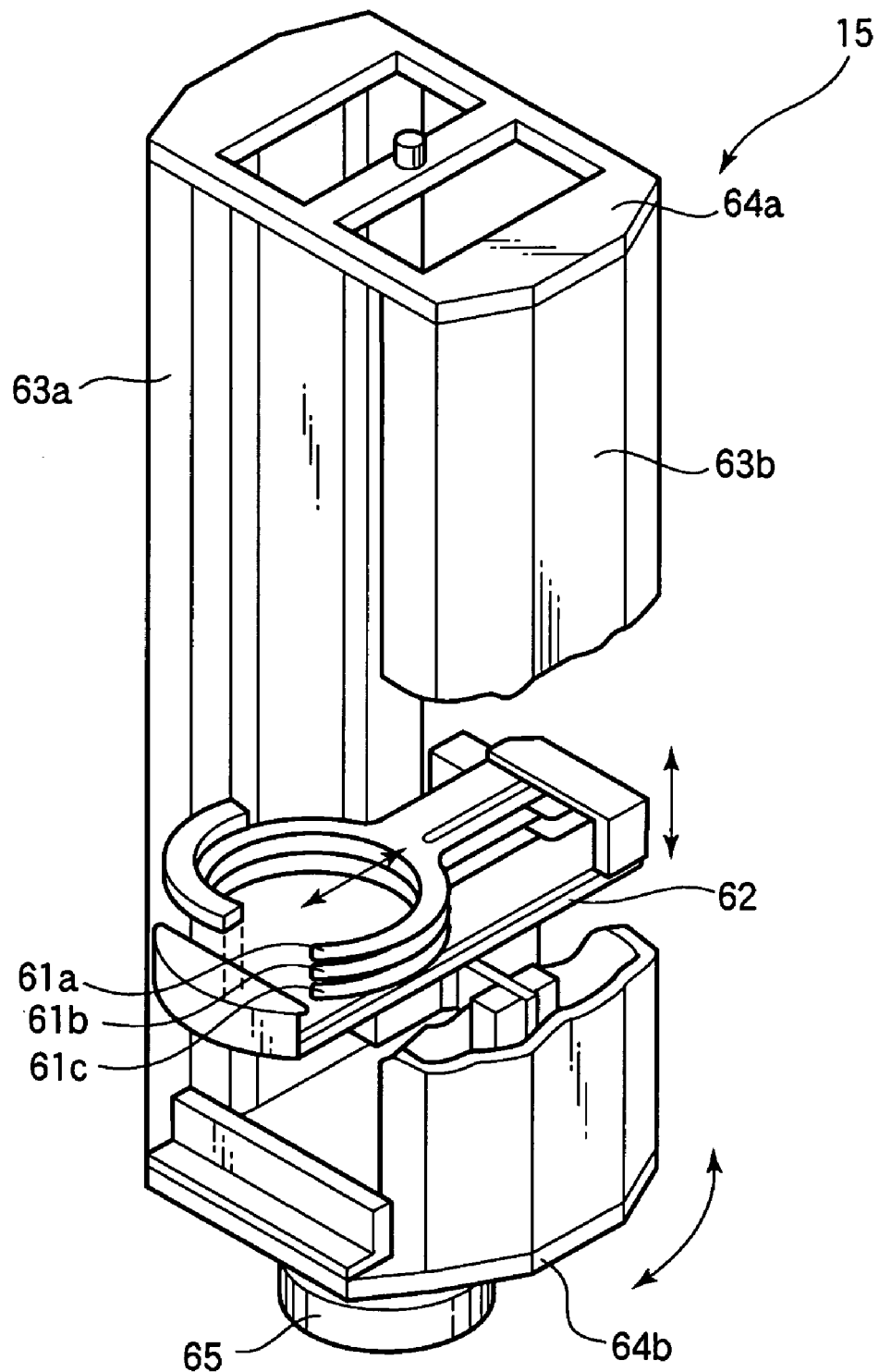
FIG. 5 is an oblique view schematically showing the construction of a main transfer mechanism.

FIG. 5 is an oblique view schematically showing the construction of the main transfer mechanism 15. As shown in the drawing, the main transfer mechanism 15 includes three arms 61a to 61c each holding a single wafer W, a base 62 movably supporting these arms 61a to 61c, a pair of guide rails 63a and 63b supporting the base 62 such that the base 62 can moved in the vertical direction, joining members 64a, 64b for fixing the upper edges and the lower edges, respectively, of the guide rails 63a, 63b, and a rotary driving section 65 mounted to the joining member 64b for rotatably driving around a vertical axis a housing formed of the guide rails 63a, 63b and the joining member 64a, 64b. It should be noted that the three arms 61a to 61c of the main transfer mechanism 15 are collectively movable in the vertical direction, collectively swingable about a vertical axis, and independently movable back and forth in the horizontal direction.

Figure 6:
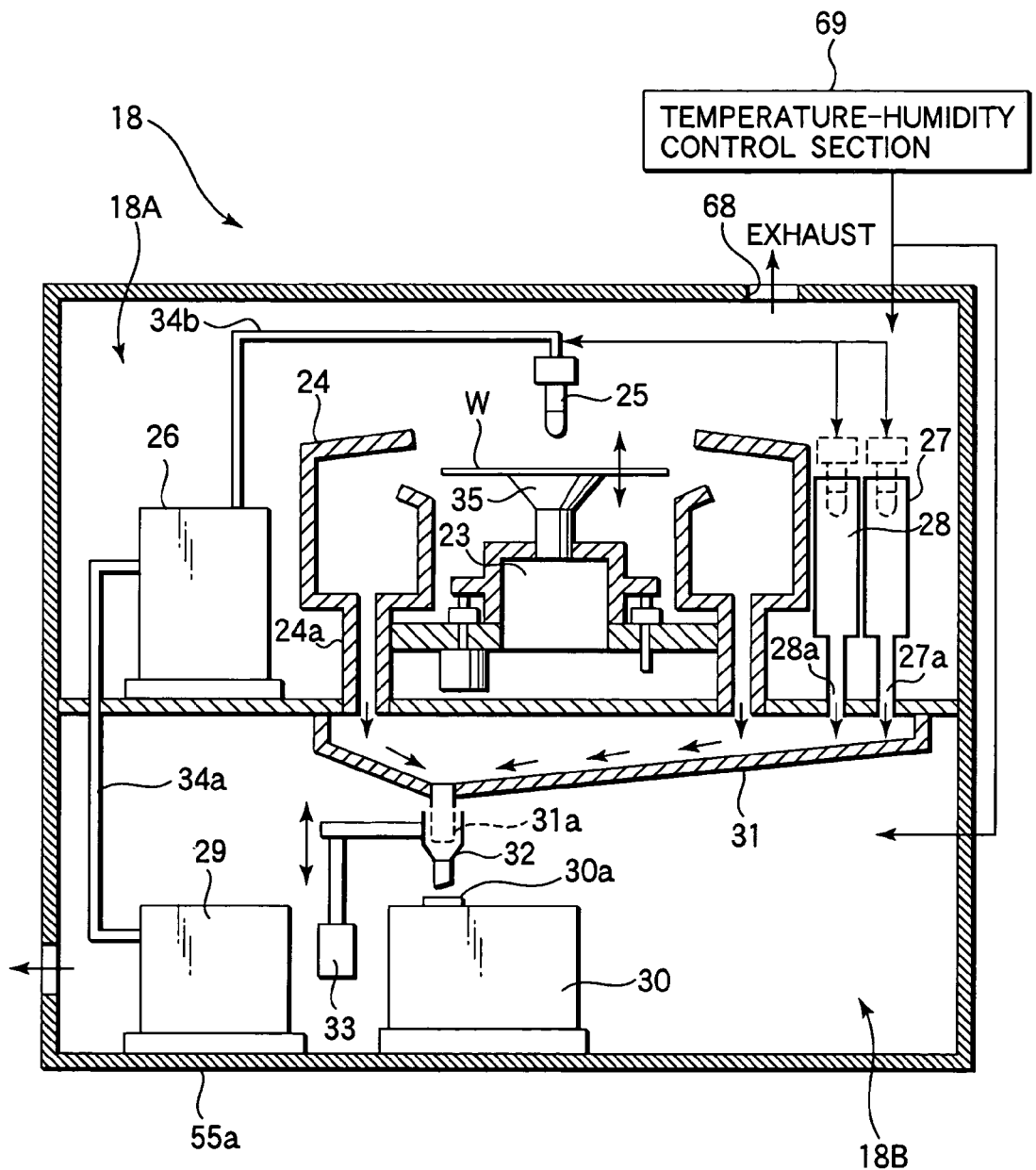
FIG. 6 is a cross sectional view schematically showing the construction of a coating unit.

Each process unit arranged within the process tower T1 will now be described in detail. FIG. 6 is a cross sectional view schematically showing the construction of the coating unit (SCT) 18. The coating unit (SCT) 18 includes a casing 55a. The casing 55a is divided into an upper stage and a lower stage. A coater area 18A in which the wafer W is processed is formed in the upper stage. Also, a tank area 18B for supplying various chemical liquids and a cleaning liquid used in the coater area 18A and for recovering the waste liquids from the coater area 18A is formed in the lower stage. In short, the coating unit (SCT) 18 is of a two-stage structure. Incidentally, the drawing shows that the coater area 18A and the tank area 18B are formed integral within the casing 55a. Alternatively, it is also possible to employ a separable construction such that the casing forming the coater area 18A and the casing forming the tank area 18B are separable from each other.

The air controlled at a prescribed temperature and humidity is supplied from a temperature-humidity control section 69 into the coating unit (SCT) 18. The air supplied into the coater area 18A is partly discharged to the outside of the casing 55a through an exhaust port 68 formed in the casing 55a. By controlling the inner region of the coating unit (SCT) 18 at a prescribed temperature and humidity, the conditions in the step of forming the coating film can be made constant so as to make it possible to maintain constant the characteristics of the coating film thus formed.

Arranged in the coater area 18A are a spin chuck 35 holding the wafer W substantially horizontal by means of vacuum suction, a motor for rotating the spin chuck 35, a driving section 23 including a lift mechanism for moving the spin chuck 35 in the vertical direction, a cup 24 arranged to surround the periphery of the spin chuck 35 so as to recover the chemical liquid scattered from the wafer W held by the spin chuck 35, a supply nozzle 25 for supplying the chemical liquid onto substantially the center of rotation of the wafer W held by the spin chuck 35, a pump 26 for supplying the chemical liquid into the supply nozzle 25, a dummy dispense port 27 for allowing the supply nozzle 25 to perform the dummy dispense of, for example, the chemical liquid remaining in the supply nozzle 25, a solvent bath 28 for suppressing the drying at the tip of the supply nozzle 25, and a nozzle-moving mechanism (not shown) for moving the supply nozzle 25 between a prescribed position above the wafer W and a region including the dummy dispense port 27 and the solvent bath 28.

On the other hand, arranged in the tank area 18B are a chemical liquid tank 29 for storing the chemical liquid, a waste liquid tank 30 for storing the waste liquid discharged from the coater area 18A, and a waste liquid recovery vessel 31 for recovering the waste liquid discharged from the coater area 18A.

For example, if the arm of the main transfer mechanism 15, e.g., the arm 61a holding the wafer W, is inserted into the coater area 18A so as to be positioned above the spin chuck 35, the spin chuck 35 is moved upward to receive the wafer W from the arm 61a. After the arm 61a is retreated from the coater area 18A and the spin chuck 35 is moved downward to a prescribed position, a chemical liquid used for forming an insulating film is supplied from the supply nozzle 25 onto substantially the center of the surface of the wafer W held by the spin chuck 35 and, then, the spin chuck 35 is rotated at a prescribed rotating speed. As a result, the chemical liquid is centrifugally spread in the radial direction of the wafer W and, thus, a coating film is formed on the surface of the wafer W.

A drain pipe 24a extending downward in substantially the vertical direction is connected to the bottom wall of the cup 24. The lower edge of the drain pipe 24a is open and connected to the waste liquid recovery vessel 31. The chemical liquid scattered from the wafer W in accordance with rotation of the spin chuck 35 and received by the cup 24 is guided through the drain pipe 24a into the waste liquid recovery vessel 31.

Figure 7:
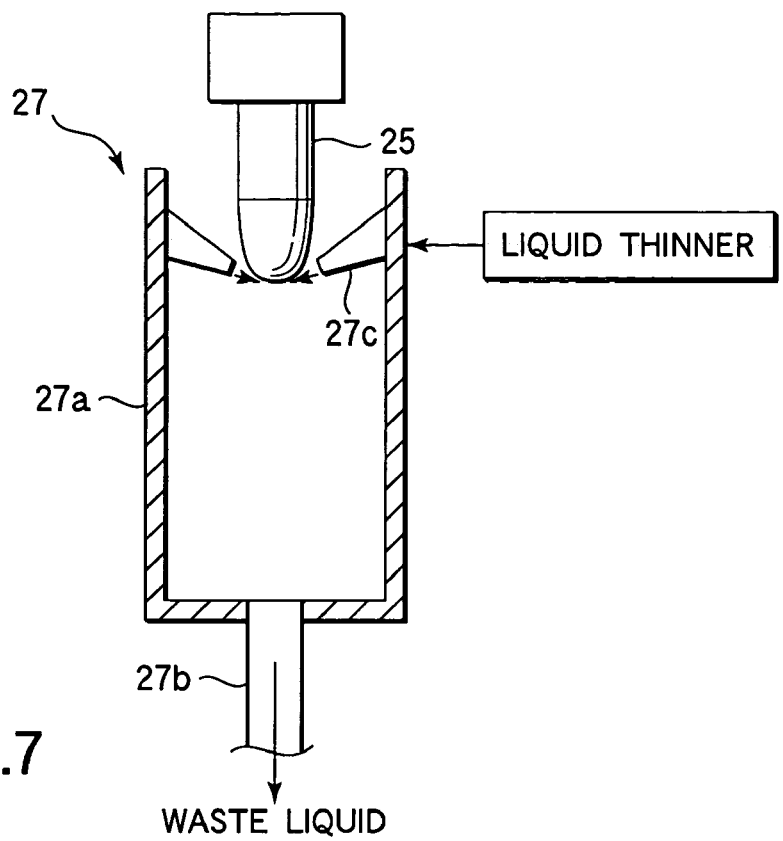
FIG. 7 is a cross sectional view schematically showing the construction of a dummy dispense port.

FIG. 7 is a cross sectional view schematically showing the construction of the dummy dispense port 27. The dummy dispense port 27 includes a liquid receiving section 27a for receiving the chemical liquid discharged from the supply nozzle 25, a discharge pipe 27b connected at one end to the liquid receiving section 27a, and a thinner discharging nozzle 27c for discharging a liquid thinner used as a solvent of the chemical liquid. In performing the dummy dispense operation, the supply nozzle 25 is held under the state that the tip of the supply nozzle 25 is pushed into an upper portion of the liquid receiving section 27a, and a thinner is discharged from the thinner discharging nozzle 27c toward the tip portion of the supply nozzle 25 to remove the chemical liquid attached to the supply nozzle 25. The other edge of the discharge pipe 27b connected to the waste liquid recovery vessel 31 is open so as to permit the chemical liquid discharged from the supply nozzle 25 and the thinner liquid discharged from the thinner discharging nozzle 27c during the dummy dispense operation to be introduced into the waste liquid recovery vessel 31.

Figure 8:
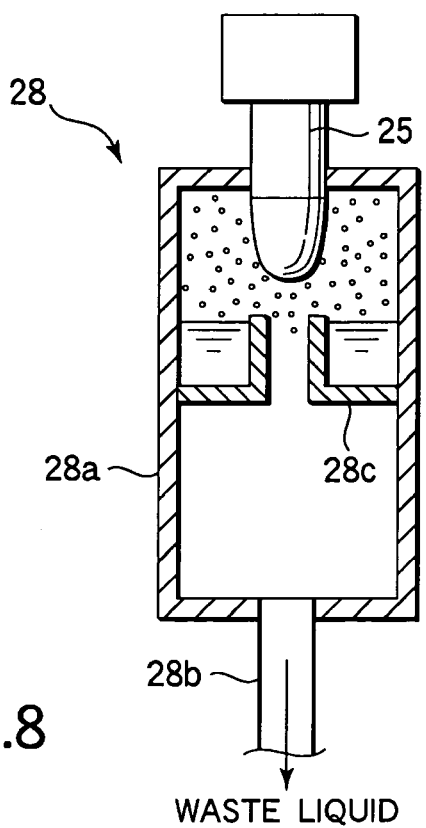
FIG. 8 is a cross sectional view schematically showing the construction of a solvent bath.

FIG. 8 is a cross sectional view schematically showing the construction of the solvent bath 28. The solvent bath 28 is formed of a hermetic container 28a including a storing section 28c for storing the thinner liquid acting as a solvent of the chemical liquid. A vapor atmosphere of the solvent is formed within the hermetic container 28a. When the chemical liquid is not discharged, the supply nozzle 25 is held under the state that the tip portion of the supply nozzle 25 is inserted into the inner region of the hermetic container 28a. The tip of the supply nozzle 25 can be prevented from being dried because the tip of the supply nozzle 25 is exposed to the vapor atmosphere of the solvent when the chemical liquid is not supplied. Incidentally, a discharge pipe 28b of, for example, the solvent is connected at one edge to the bottom of the hermetic container 28a. The other edge of the discharge pipe 28b is open to the waste liquid recovery vessel 31.

The waste liquid recovery vessel 31 formed within the tank area 18B covers the open edge of the drain pipe 24a of the cup 24 and the open edges of the discharge pipes 27b, 28b of the dummy dispense port 27 and the solvent bath 28, respectively. Also, a pipe 31a extending downward in the vertical direction is connected at the upper edge to the bottom portion of the waste liquid recovery vessel 31. The waste liquid recovery vessel 31 is formed such that the portion to which the pipe 31a is connected is positioned in the deepest point and that the inner surface of the waste liquid recovery vessel 31 is gradually inclined downward from the peripheral portion toward the pipe 31a.

A funnel 32 is mounted to the pipe 31a in a manner to cover the lower edge portion of the pipe 31a. The waste liquid discharged from the pipe 31a flows downward along the inner surface of the funnel 32 so as to be discharged to the outside through an opening formed in the lower edge of the funnel 32. The funnel 32 can be moved in the vertical direction by a lift mechanism 33. When the waste liquid is to be stored in the waste liquid tank 30, the funnel 32 is held at a low position such that the lower edge of the funnel 32 is positioned in the vicinity of an inlet port 30a of the waste liquid tank 30. On the other hand, when, for example, the waste liquid tank 30 is renewed, the funnel 32 is moved upward so as to permit the lower edge of the funnel 32 to be positioned sufficiently apart from the inlet port 30a.

As described above, the waste liquid passageway for discharging the waste liquid from the coater area 18A into the waste liquid tank 30 is formed of the drain pipe 24a, etc., the pipe 31a and the funnel 32. What should be noted is that the waste liquid passageway noted above does not include a substantially horizontal portion. As a result, the waste liquid discharged from the coater area 18A is unlikely to stagnate in the waste liquid passageway until the waste liquid is introduced into the waste liquid tank 30. It follows that the waste liquid is unlikely to be solidified so as to make it possible to recover smoothly the waste liquid.

A liquid supply pipe 34a formed between the chemical liquid tank 29 arranged within the tank area 18B and the pump 26 arranged within the coater area 18A extends over substantially the shortest distance. Likewise, a liquid supply pipe 34b formed between the pump 26 and the supply nozzle 25 extends over substantially the shortest distance. As a result, it is possible to decrease the amount of the chemical liquid that is discharged when the bubbles are removed during, for example, the dummy dispense operation and during the replacement of the chemical liquid tank 29.

Incidentally, in the embodiment described above, the coating unit (SCT) 18 is constructed such that the chemical liquid dripped onto the central portion on the surface of the wafer W is centrifugally spread in the radial direction of the wafer W by the rotation of the wafer W so as to form a chemical liquid layer on the surface of the wafer W. Alternatively, it is also possible to employ a so-called "single stroke type coating device", i.e., a scan coating device in which the nozzle for supplying the chemical liquid is moved relative to the wafer so as to supply the chemical liquid onto the wafer surface in the form of, for example, a rectangular wave. It is also possible to employ an apparatus using a slit type nozzle that supplies the chemical liquid in the form of a band.

Figure 9:
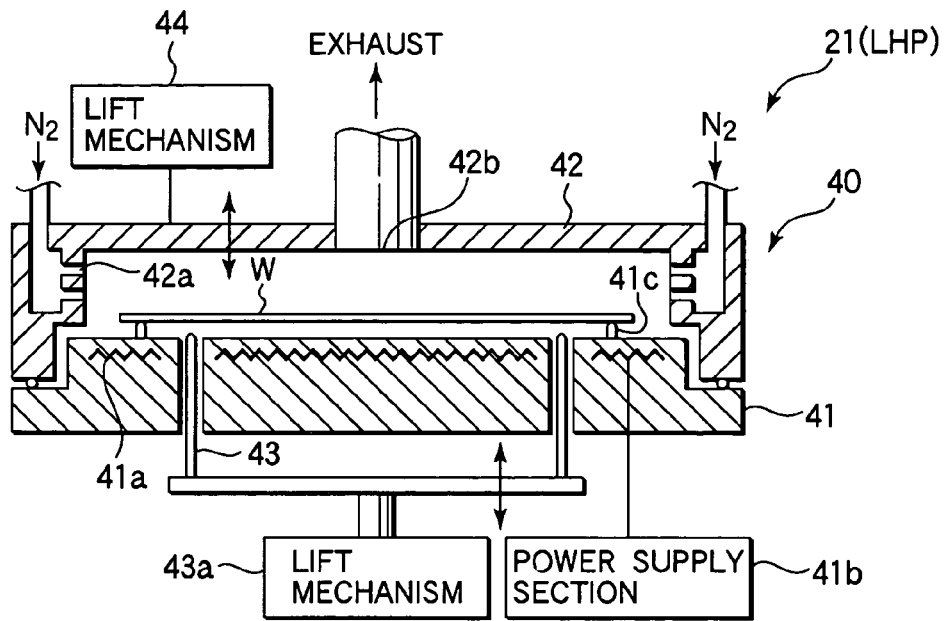
FIG. 9 is a cross sectional view schematically showing the construction of a low temperature heating unit.

The heat processing area will now be described. FIG. 9 is a cross sectional view schematically showing the construction of the low temperature heating unit (LHP) 21. The low temperature heating unit (LHP) 21 comprises a heating plate 41 and a lid 42 collectively forming a processing container 40, a lift pin 43 for delivering the wafer W onto the main transfer mechanism 15 and onto the heating plate 41, a lift mechanism 43a for moving the lift pin 43 in the vertical direction, and a lift mechanism 44 for moving the lid 42 in the vertical direction.

A heater 41a that generates heat by an electric power supplied from a power supply section 41b is buried in the heating plate 41. As a result, the heating plate 41 can be maintained at a prescribed temperature, e.g., about 100° C. to about 130° C. Also, a proximity pin 41c for supporting the wafer W is formed on the upper surface of the heating plate 41, and the lift pin 43 extends through the heating plate 41. A gas supply port 42a and an exhaust port 42b for exhausting the inner region of the processing container 40 are formed in the lid 42. A nitrogen gas ($N_2$) supplied from a nitrogen gas supply source (not shown) is introduced into the processing container 40 through the gas supply port 42a formed in the lid 42.

If the arm of the main transfer mechanism 15, e.g., the arm 61a holding the wafer W, is inserted into the clearance between the heating plate 41 and the lid 42 included in low temperature heating unit (LHP) 21 under the state that the lid 42 is moved upward, the lift pin 43 is moved upward so as to receive the wafer W from the arm 61a. If the lift pin 43 is moved downward after the arm 61a is retreated, the wafer W is supported by the proximity pin 41c. Then, the lid 42 is moved downward so as to hermetically close the processing container 40. Under this condition, a nitrogen gas is substituted within the processing container 40 so as to form a low oxygen atmosphere, followed by heating the heating plate 41 to a prescribed temperature, e.g., 100° C. As a result, the solvent contained in the coating film formed on the wafer W is evaporated so as to dry the coating film.

Incidentally, the temperature control unit (CPL) 20 is substantially equal in construction to the low temperature heating unit (LHP) 21, except that a wafer table equipped with a cooling mechanism, i.e., a cooling plate, is arranged in the temperature control unit (CPL) 20 in place of the heating plate 41 equipped with the heater 41a, though the detailed construction of the temperature control unit (CPL) 20 is not shown in the drawing. The wafer W is disposed on the cooling plate for a prescribed time in the temperature control unit (CPL) 20 so as to control the wafer W at a prescribed temperature.

Figure 10:
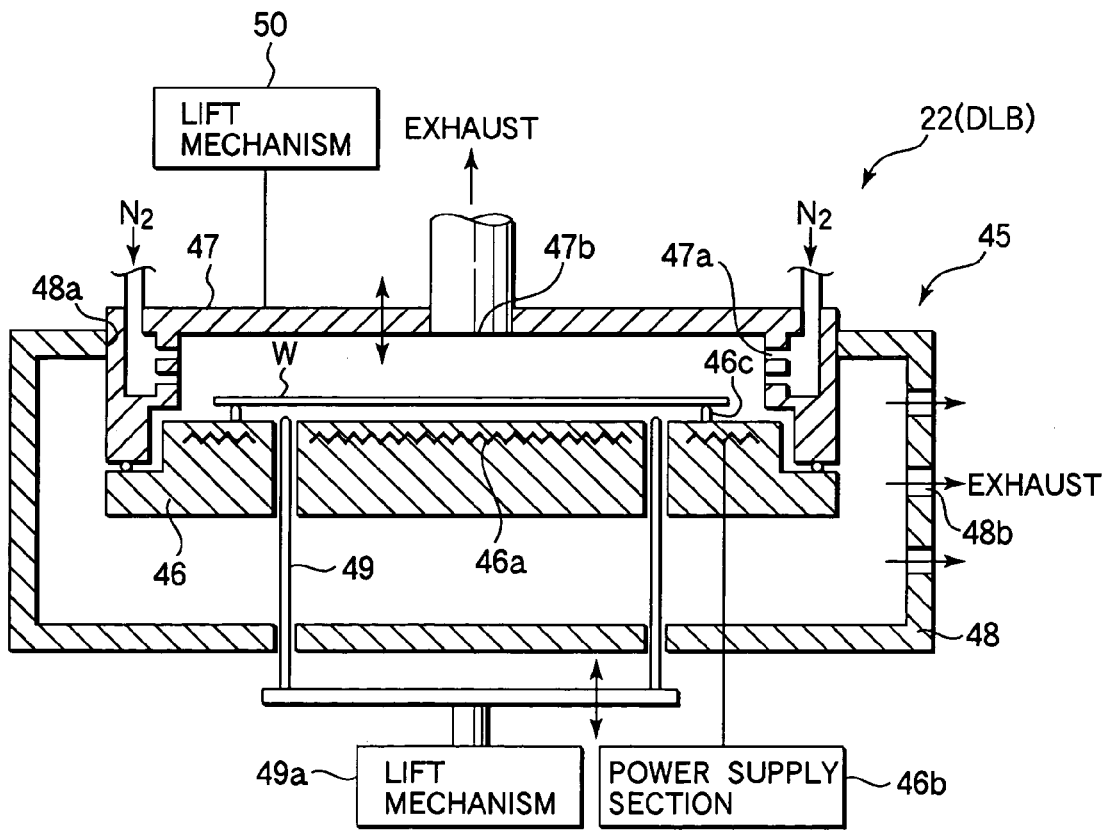
FIG. 10 is a cross sectional view schematically showing the construction of a baking unit.

FIG. 10 is a cross sectional view schematically showing the construction of the baking unit (DLB) 22. As shown in the drawing, the baking unit (DLB) 22 comprises a heating plate 46 and a lid 47 collectively forming a processing container 45, a casing 48 surrounding the heating plate 46, a lift pin 49 extending through the heating plate 46 and the bottom plate of the casing 48, a lift mechanism 49a for moving the lift pin 49 in the vertical direction, and a lift mechanism 50 for moving the lid 47 in the vertical direction.

A wafer transfer port (not shown) is formed in one side wall of the casing 48. It is possible for the arms 61a to 61c of the main transfer mechanism 15 to be moved through the wafer transfer port for transferring the wafer W. Also, an exhaust port 48b for exhausting the inner region of the casing 48 is formed in another side wall of the casing 48. It should be noted that an open portion 48a formed in the upper wall of the casing 48 is closed by the lid 47.

A heater 46a that generates heat by an electric power supplied from a power supply section 46b is buried in the heating plate 46. As a result, it is possible to maintain the heating plate 46 at a prescribed temperature, e.g., about 150° C. to about 350° C. Also, a proximity pin 46c for supporting the wafer W is formed on the upper surface of the heating plate 46, and the lift pin 49 extends through the heating plate 46 and the bottom plate of the casing 48. Further, a gas supply port 47a and an exhaust port 47b for exhausting the inner region of the processing container 45 are formed in the lid 47. A nitrogen gas ($N_2$) supplied from a nitrogen gas supply source (not shown) is introduced through the gas supply port 47a into the processing container 45.

The baking unit (DLB) 22 is substantially equal to the low temperature heating unit (LHP) 21 in the mode of the heat processing. Specifically, the wafer W transferred by the main transfer mechanism 15 through the wafer transfer port (not shown) formed in the casing 48 is received by the lift pin 49 and, then, disposed on the heating plate 46. Further, the processing container 45 is hermetically closed. Under this condition, an $N_2$ gas atmosphere is set up within the processing container 45, and the heating plate 46 is heated to a prescribed temperature so as to apply a baking processing to the wafer W.

Figure 11:
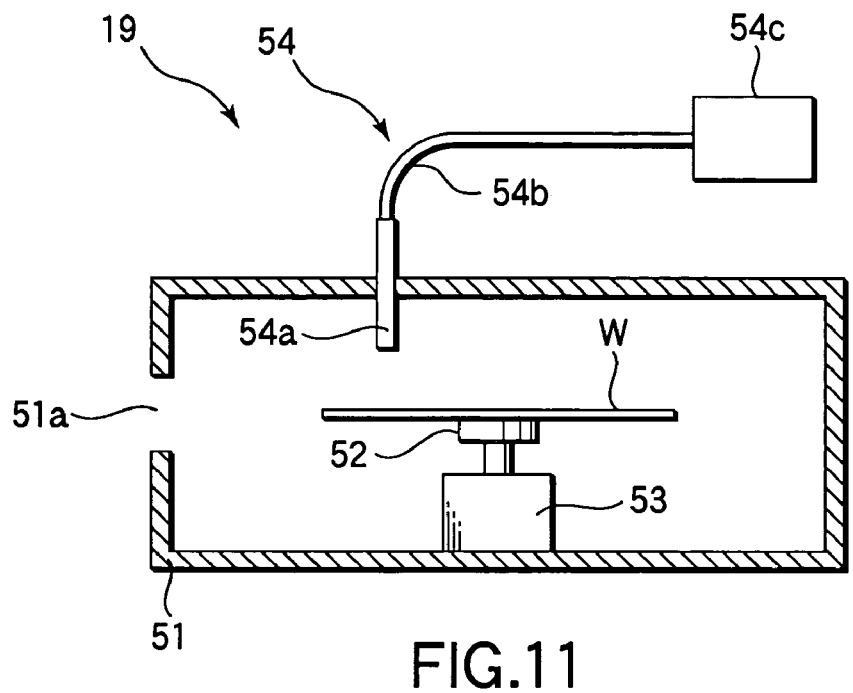
FIG. 11 is a cross sectional view schematically showing the construction of a measuring unit of a film thickness.

FIG. 11 is a cross sectional view schematically showing the construction of the film thickness measuring unit 19. As shown in the drawing, the film thickness measuring unit 19 comprises a casing 51 having a transfer port 51a formed in the side wall thereof, a table 52 arranged within the casing 51 for allowing the wafer W to be disposed thereon, a driving mechanism 53 for rotating the table 52 and moving the table 52 in the X- and Y-directions, and a light interference type film thickness meter 54.

The light interference type thickness meter 54 includes a probe 54a positioned to face the surface of the wafer W disposed on the table 52, an optical fiber 54b, and a spectroscopic unit 54c including a spectroscope and a controller. The light interference type film thickness meter 54 obtains a spectrum on the basis of the reflected light of the light irradiating the surface of the wafer W and detects the film thickness based on the spectrum thus obtained.

In the film thickness measuring unit 19, the wafer W is moved in the X- and Y-directions, with the result that the probe 54a is allowed to face the wafer W in many points along, for example, the diameter of the wafer W. It follows that the film thickness is measured by the probe 54a at many points of the wafer W.

The process tower T1 housing the various process units described above is detachable from the housing 102 as shown in FIG. 2. In other words, it is possible to exchange the process tower T1 for another process tower. In the SOD method, many kinds of chemical liquids are used. Since the process step and the process conditions such as the process atmosphere are changed depending on the kind of the chemical liquid used, it is advisable to prepare in advance a plurality of process towers each consisting of a plurality of process units handling the same kind of the chemical liquid. If the required process tower is incorporated in the process block 8, it is possible to change easily the SOD system 100A to conform with the kind of the chemical liquid used without applying a cleaning processing to the coating unit and without changing the process recipe of each of the heat processing units. Also, since it is possible to finish a series of processing handling a waste liquid and a waste gas in a single process tower, it is possible to separate completely the chemicals that must not be mixed because a harmful substance may be generated by the mixing. It follows that the safety can be enhanced. Further, where some of the process units arranged within the process tower T1 have got out of order, it is possible to substitute another process tower (or an auxiliary process tower) for the process tower T1 so as to make it possible to continue the processing of the wafer W.

Figure 12:
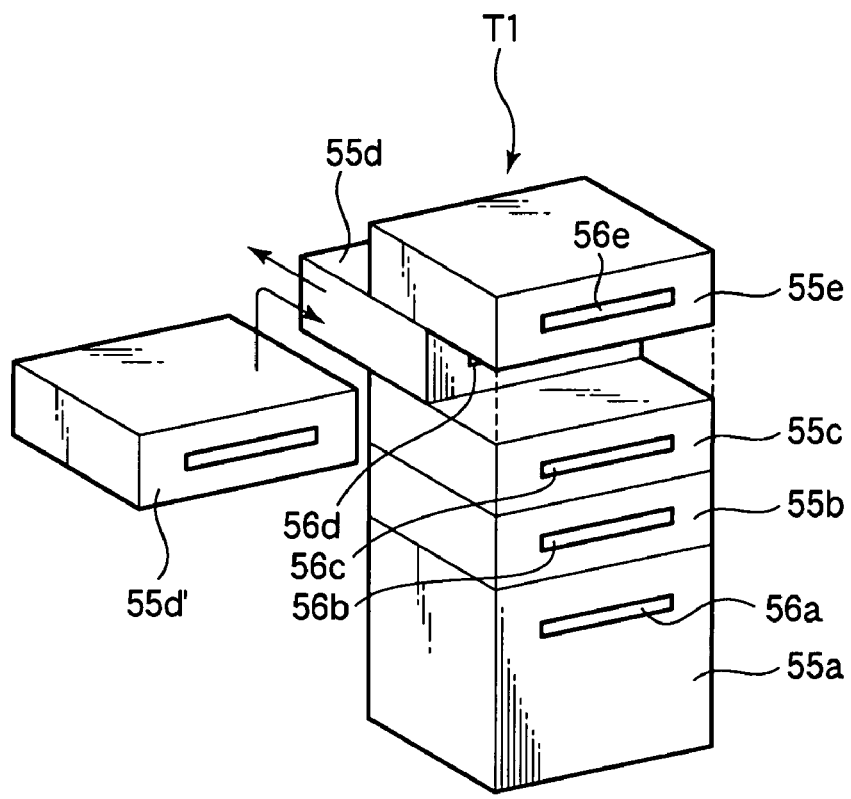
FIG. 12 schematically illustrates how to replace the process units in the process tower.

It is possible to substitute other process units for the various process units arranged within the process tower T1. FIG. 12 schematically shows the mode of replacement of the process unit in the process tower T1. As described previously, arranged in the process tower T1 are the film thickness measuring unit 19, the temperature control unit (CPL) 20, the low temperature heating unit (LHP) 21, and the baking unit (DLB) 22. These process units 19 to 22 are housed in the casings 55b to 55e, respectively, and the casing 55a constitutes the coating unit (SCT) 18. Wafer transfer ports 56a to 56e for transferring the wafer W into and out of the casings 55a to 55e are formed in the side walls of the casings 55a to 55e.

In the process tower T1, it is possible to pull, for example, the casing 55d out and the low temperature heating unit (LHP) 21 housed in the casing 55d and to arrange a casing 55d' accommodating a prescribed process unit in the free space formed by pulling the casing 55d out. The particular construction makes it possible to optimize the construction of the process unit arranged within the process tower T1 in accordance with the processing procedure of the wafer W. Also, where some of the process units have got out of order, it is possible to replace the particular process units alone by other process units (or auxiliary process units) so as to make it possible to avoid the decrease of the productivity.

Figure 13:
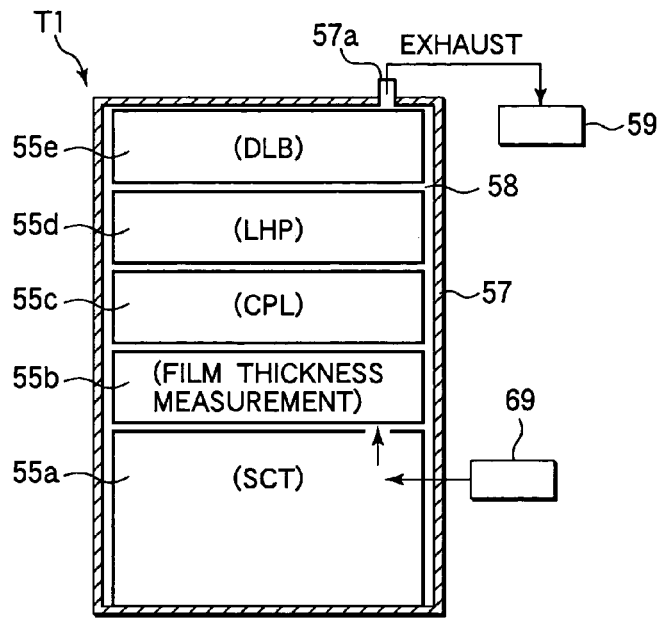
FIG. 13 illustrates the arranged state of casings in a housing.

FIG. 13 shows how the casings 55a to 55e are housed in a housing 57. The casings 55a to 55e are detachable from the housing 57 (not shown in FIG. 12). A clearance 58 is formed between the casings 55a to 55e and the inner surface of the housing 57. The air discharged from the exhaust port 68 (see FIG. 6) formed in the casing 55a of the coating unit (SCT) 18, the temperature and humidity of the discharged air being controlled, flows into the clearance 58. The air flowing through the clearance 58 is discharged to the outside by an exhaust device 59 through an exhaust port 57a formed in the housing 57.

Figure 14:
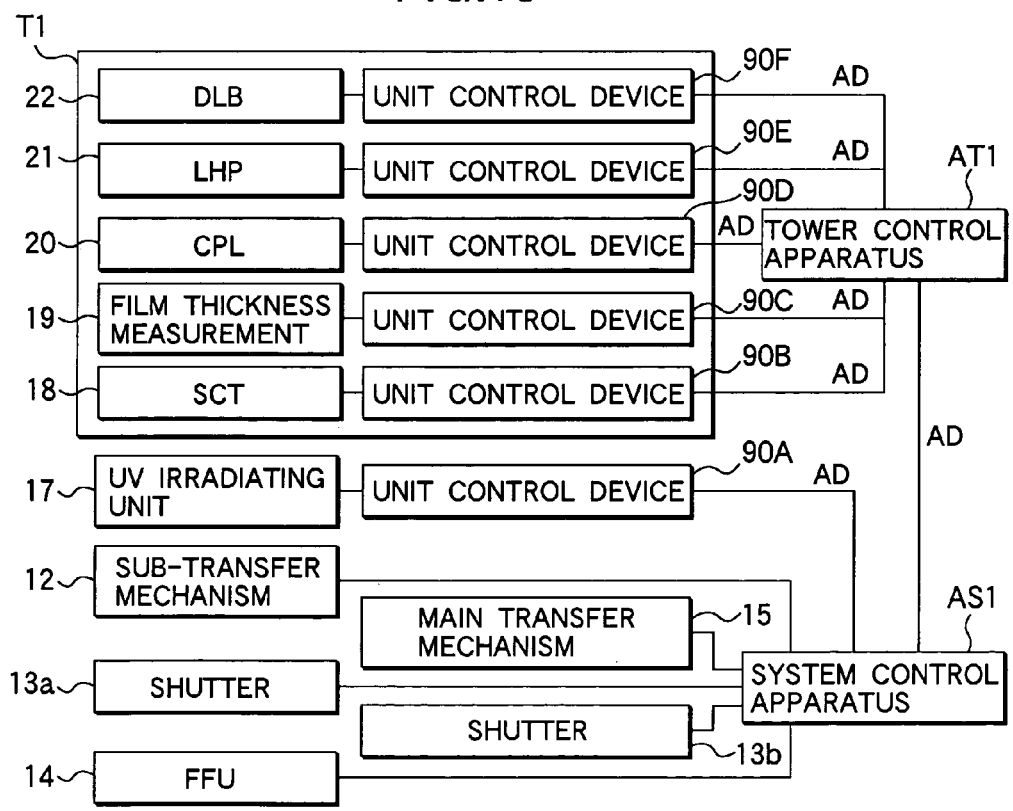
FIG. 14 schematically illustrates the control mode of the SOD system shown in FIG. 1.

The control mode of the SOD system 100A will now be described. FIG. 14 shows the entire SOD system 100A and the control mode thereof. A system control apparatus AS1 for controlling the entire SOD system 100A comprises a CPU, a memory, a program stored in the memory, etc. and serves to control directly shutters 13a, 13b, the sub-transfer mechanism 12, the main transfer mechanism 15, the fan filter unit (FFU) 14, etc., which are essential constituents. Also, as described herein later, it is possible to connect a prescribed number of control devices including the unit control device for controlling each of the various process units, the tower control apparatus for controlling the process tower, and the block control device for controlling the additional process blocks arranged later to the system control apparatus AS1.

The UV irradiating unit (DVT) 17 is controlled by a unit control device 90A. To be more specific, an electric signal indicating, for example, the transfer state of the wafer W is transmitted between the unit control device 90A and the system control apparatus AS1 so as to permit the wafer W to be transferred smoothly into or out of the UV irradiating unit (DVT) 17. Each of the UV irradiating unit (DVT) 17 and the unit control device 90A has an inherent ID number. Also, each of the unit control device 90A and the system control apparatus AS1 is equipped with a prescribed hardware and a prescribed software such that, if the unit control device 90A is connected to the system control apparatus AS1, the system control apparatus AS1 automatically recognizes the unit information such as the control parameter of the UV irradiating unit (DVT) 17 as denoted by 'AD' in FIG. 14.

As the method of the automatic recognition described above, it is possible to employ the method that the ID number and the unit information are transmitted from the unit control device 90A to the system control apparatus AS1. It is also possible to employ the method that the system control apparatus AS1 is provided with the data base in which the unit information for each ID number is stored. In this case, if the ID number is transmitted from the unit control device 90A to the system control apparatus AS1, the unit information relating to the ID number is searched in the system control apparatus AS1 by utilizing the data base.

A tower control apparatus AT1 formed of a CPU, a memory, a program stored in the memory, etc. serves to control the entire process tower T1, i.e., serves to prepare and supervise the process recipe for each of the process units arranged in the process tower T1.

The coating unit (SCT) 18, the film thickness measuring unit 19, the temperature control unit (CPL) 20, the low temperature heating unit (LHP) 21, and the baking unit (DLB) 22 arranged in the process tower T1 are operated by an exclusive unit control devices 90B, 90C, 90D, 90E and 90F, respectively. For example, the coating unit (SCT) 18 and the unit control device 90B thereof have an inherent ID number. If the unit control device 90B is connected to the tower control apparatus AT1, the unit information on the coating unit (SCT) 18 is automatically recognized by the tower control apparatus AT1. The particular construction is also employed in each of the film thickness measuring unit 19, the temperature control unit (CPL) 20, the low temperature heating unit (LHP) 21, and the baking unit (DLB) 22.

Incidentally, the unit control device 90B for the coating unit (SCT) 18 serves to move the spin chuck 35 in the vertical direction and to rotate the spin chuck 35, to move the supply nozzle 25, to permit the chemical liquid to be discharged from the supply nozzle 25, and to operate the pump 26. The unit control device 90C for the film thickness measuring unit 19 serves to permit the driving mechanism 53 to drive the table 52 in the X- and Y-directions, to process the signal obtained from the spectroscopic unit 54c so as to determine the thickness in various points of the wafer W, to prepare a film thickness distribution chart, and to obtain an average thickness of the film. The unit control device 90E for the low temperature heating unit (LHP) 21 serves to control the output from the power supply section 41b to the heater 41a, to control the lift mechanisms 43a and 44, and to control the supply and exhaust of the $N_2$ gas. Further, the unit control device 90F for the baking unit (DLB) 22 serves to control the output from the power supply section 46b to the heater 46a, to control the lift mechanisms 49a and 50, and to control the supply and exhaust of the $N_2$ gas.

The unit information on each of the process units arranged in the process tower T1 is stored in the tower control apparatus AT1. When the tower control apparatus AT1 is connected to the system control apparatus AS1, the unit information stored in the tower control apparatus AT1 is automatically recognized by the system control apparatus AS1. As a result, it is possible for the system control apparatus AS1 to grasp the construction of the SOD system 100A. Because of the particular control mode, the processing process of the wafer W can be supervised easily in the SOD system 100A.

As described previously, each of the process units arranged within the process tower T1 can be replaced easily by another process unit. Therefore, where a process unit arranged in the process tower T1 is replaced by another process unit, the unit control device accompanying said another process unit is connected to the tower control apparatus AT1. As a result, the tower control apparatus AT1 automatically recognizes the new process unit so as to prepare a process recipe of the process tower T1 of the new construction, and the processing of the wafer W in the new process tower T1 is controlled. Where the process tower T1 is constructed to be controlled by the tower control apparatus AT1 as described above, the process unit arranged within the process tower T1 can be replaced easily.

Also, the process tower T1 is detachable from the housing 102 as described previously. Therefore, where the process tower T1 is replaced by another process tower, the tower control apparatus AT1 is also replaced simultaneously by another tower control apparatus for said another process tower, and said another tower control apparatus is connected to the system control apparatus AS1. As a result, the system control apparatus AS1 automatically recognizes said another process tower and the construction of the process units arranged in the new process tower so as to control the SOD system of the new construction.

Incidentally, it is possible to allow the tower control apparatus AT1 to perform the function of correcting the process parameter of each of the process units arranged in the process tower T1 based on the data on the film thickness measured in the film thickness measuring unit 19. The data on the film thickness measured in the film thickness measuring unit 19 are transferred into the tower control apparatus AT1, and the tower control apparatus AT1 serves to correct the corresponding process parameter based on the measured data. Then, the parameter after the correction is transferred into the relating unit control device.

In the case of measuring, for example, the thickness of the coating film formed in the coating unit (SCT) 18, the parameter corrected in the tower control apparatus AT1 includes, for example, the rotating speed and the rotating time of the spin chuck 35, the temperature and humidity within the coating unit (SCT) 18, the temperature of the chemical liquid, and the discharging rate of the chemical liquid. On the other hand, in the case of measuring the thickness of the insulating film formed by the processing in the baking unit (DLB) 22, the parameter corrected in the tower control apparatus AT1 includes, for example, the heating time and the heating temperature, the $N_2$ concentration, and the oxygen concentration in the baking unit (DLB) 22.

It is desirable to generate an alarm in the case where the film thickness measuring unit 19 has measured an abnormal film thickness that cannot be coped with by the correction of the parameter in each of the process units arranged in the process tower T1, said correction being performed by the tower control apparatus AT1. In this case, it is possible to continue the processing of the wafer W in the SOD system 100A by removing the process tower T1 from the SOD system 100A and by mounting another process tower in the SOD system 100A in place of the process tower T1. It is possible to examine in detail the cause of the trouble and to repair and improve the defective point in respect of the process tower T1 removed from the SOD system 100A.

The process step of the wafer W within the SOD system 100A will now be described. In the first step, the carriers C1 to C3 each housing, for example, 25 wafers are transferred from the outside onto the carrier table 11 included in the carrier block 7 by an automatic transfer robot or by the manual operation by the operator. Then, the sub-transfer mechanism 12 takes out the wafer W from the carrier C1 and transfers the wafer W onto the delivery unit (TRS) 16 included in the process block 8. Further, the main transfer mechanism 15 takes out the wafer W from the delivery unit (TRS) 16 so as to transfer the wafer W into the temperature control unit (CPL) 20 arranged in the process tower T1. The wafer W is controlled at a prescribed temperature (e.g., 23° C.) within the temperature control unit (CPL) 20. The wafer W having the temperature controlled is transferred by the main transfer mechanism 15 into the coating unit (SCT) 18. Within the coating unit (SCT) 18, the wafer W is coated with a chemical liquid and, thus, a coating film is formed on the wafer W.

After the coating film is formed within the coating unit (SCT) 18 on the first wafer W transferred out of the carrier C1, the first wafer W is transferred by the main transfer mechanism 15 into the film thickness measuring unit 19 for measuring the thickness of the coating film. The measured data on the thickness of the coating film is transmitted from the unit control device 90C for the film thickness measuring unit 19 to the tower control apparatus AT1. If the data on the thickness of the coating film falls within a range of the prescribed standard, the tower control apparatus AT1 permits a prescribed processing to be successively continued within the process tower T1 without changing the control parameter of the coating unit (SCT) 18. On the other hand, where the data on the thickness of the coating film fails to fall within the range of the prescribed standard, but falls within an allowable range in respect of the correction of the thickness, a prescribed parameter in the coating unit (SCT) 18 (e.g., the rotating speed of the spin chuck 35) is corrected by the tower control apparatus AT1, and the corrected value is supplied to the unit control device 90B for the coating unit (SCT) 18. After the correction of the process parameter, the processing for forming the coating film is carried out in the coating unit (SCT) 18 in accordance with the corrected process parameter. On the other hand, where the data on the thickness of the coating film fails to fall within the range of the prescribed standard and also fails to fall within an allowable range in respect of the correction of the thickness, the tower control apparatus AT1 gives an alarm to the operator of the SOD system 100A by means of, for example, the ringing of a buzzer sound, the lighting of an alarming lamp, or the display of an alarming signal on the operating screen.

The wafer W having a coating film formed thereon is transferred by the main transfer mechanism 15 into the low temperature heating unit (LHP) 21 so as to be heated to about 100° C. to about 130° C. As a result, the coating film is dried. Then, the wafer W is further transferred by the main transfer mechanism 15 into the baking unit (DLB) 22 so as to receive a prescribed baking processing at, for example, about 200° C. to about 300° C., thereby forming an insulating film on the wafer W. The baking process temperature is about 200° C. in the case of using a chemical liquid that is available under the trade name of "LKD", is about 300° C. in the case of using a chemical liquid that is available under the trade name of "SiLK", is about 240° C. in the case of using a chemical liquid that is available under the trade name of "AlCaP", and is about 200° C. in the case of using a chemical liquid that is available under the trade name of "DUO".

After the baking processing in the baking process unit (DLB) 22, the first wafer W transferred out of the carrier C1 is further transferred by the main transfer mechanism 15 into the film thickness measuring unit 19 for measuring the thickness of the insulating film formed by the baking processing. The measured data on the thickness of the insulating film thus formed is transmitted to the tower control apparatus AT1. If the data on the thickness of the insulating film falls within a range of the prescribed standard, the tower control apparatus AT1 permits the second wafer W et seq. to be processed within the process tower T1. On the other hand, where the data on the thickness of the insulating film fails to fall within the range of the prescribed standard, but falls within an allowable range in respect of the correction, the process parameters within the baking unit (DLB) 22 such as the heating temperature, the heating time, and the $N_2$ concentration are corrected. The second wafer W et seq. are processed within the baking unit (DLB) 22 in accordance with the corrected process parameters. On the other hand, where the data on the thickness of the insulating film fails to fall within the range of the prescribed standard and also fails to fall within an allowable range in respect of the correction, a prescribed alarm is given and the processing in the process tower T1 is stopped.

After the baking processing, the wafer W is transferred by the main transfer mechanism 15 into the delivery unit (TRS) 16 and, then, brought back into the carrier C1 by the sub-transfer mechanism 12.

Incidentally, depending on the kind of the chemical liquid, formation of the insulating film is not finished by the baking processing. To be more specific, a desired insulating film is obtained in some cases after application of a so-called "curing processing" to the coating film, i.e., a curing processing in which the coating film is heated to a temperature higher than the baking process temperature so as to promote the crosslinking or the desorption of porogen, thereby curing the coating film. In this case, a prescribed curing processing is applied to the wafer W after completion of a prescribed processing that was applied by the SOD system 100A. The curing processing noted above is applied by using a curing apparatus that is arranged separately from the SOD system 100A.

In the series of processing performed by the SOD system 100A, the measurement of the film thickness performed by the film thickness measuring unit 19 can be applied to all the wafers W. Alternatively, it is also possible to perform the thickness measurement by using a monitoring wafer formed of, for example, a bare wafer. If the thickness of the coating film is monitored appropriately, it is possible to detect easily an abnormality of the film thickness, and it can be found easily in which process unit of which process tower the abnormality has been caused. As a result, the wafer W can be supervised easily.

For processing the wafer W in the SOD system 100A, it is possible for the wafer W to be coated twice with the chemical liquid in order to increase the thickness of the insulating film. In this case, a first coating film is formed on the wafer surface in the coating unit (SCT) 18, followed by applying a drying processing to the first coating film in the low temperature heating unit (LHP) 21 and subsequently applying a baking processing to the dried film in the baking unit (DLB) 22. Further, a surface modifying processing is applied to the baked film in the UV irradiating unit (DVT) 17, followed by the formation of a second coating film, the drying processing, and the baking processing in the order mentioned. Alternatively, it is also possible to perform the formation of the first coating film, the drying process, the surface modifying process, the formation of the second coating film, the drying process and the baking process in the order mentioned. In the case of employing the particular method, it is possible to enhance the uniformity of the film thickness, compared with the case of using a chemical liquid having a high viscosity. It is also possible to suppress the solidification of the chemical liquid within the pipe or at the tip of the nozzle.

Figure 15:
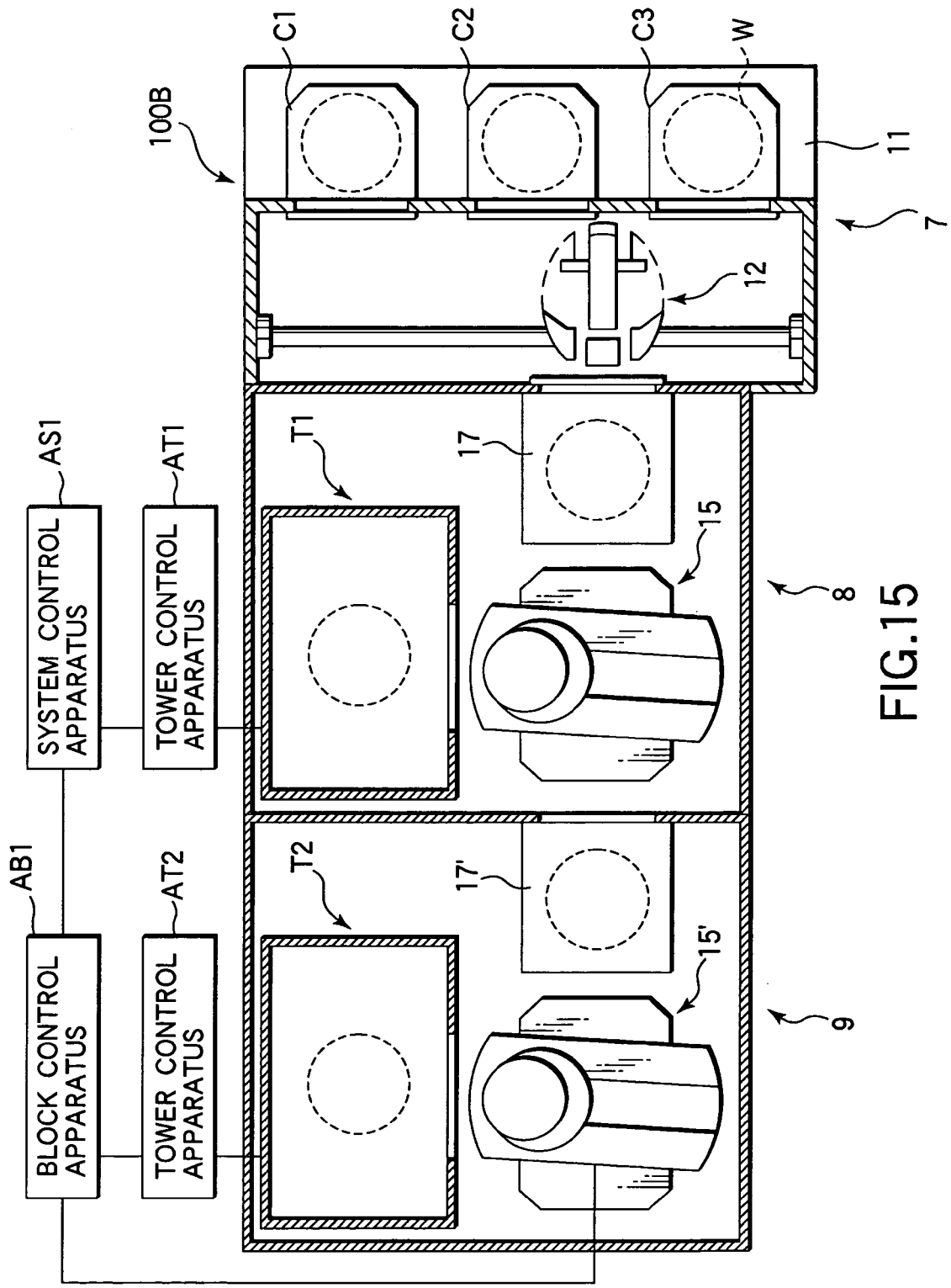
FIG. 15 is a horizontal cross sectional view schematically showing the construction of another SOD system.

Other embodiments of the SOD system will now be described. FIG. 15 is a horizontal cross sectional view schematically showing the construction of an SOD system 100B prepared by mounting an additional process block 9 to the SOD system 100A described previously. The additional process block 9 is equal in construction to the process block 8. To be more specific, the additional process block 9 comprises a process tower T2 for performing a prescribed processing for forming an insulating film on the wafer W, a transfer unit (TRS), not shown, for transferring the wafer W into and out of the process block 8, a UV irradiating unit (DVT) 17' arranged on the transfer unit (TRS) referred to above, and a main transfer mechanism 15' for transferring the wafer W within the additional process block 9. A plurality of process units arranged within the process tower T2 can be replaced by other process units like the process units arranged in the process tower T1. Also, it is possible to replace the process tower T2 arranged within the additional process block 9 by another process tower.

Figure 16:
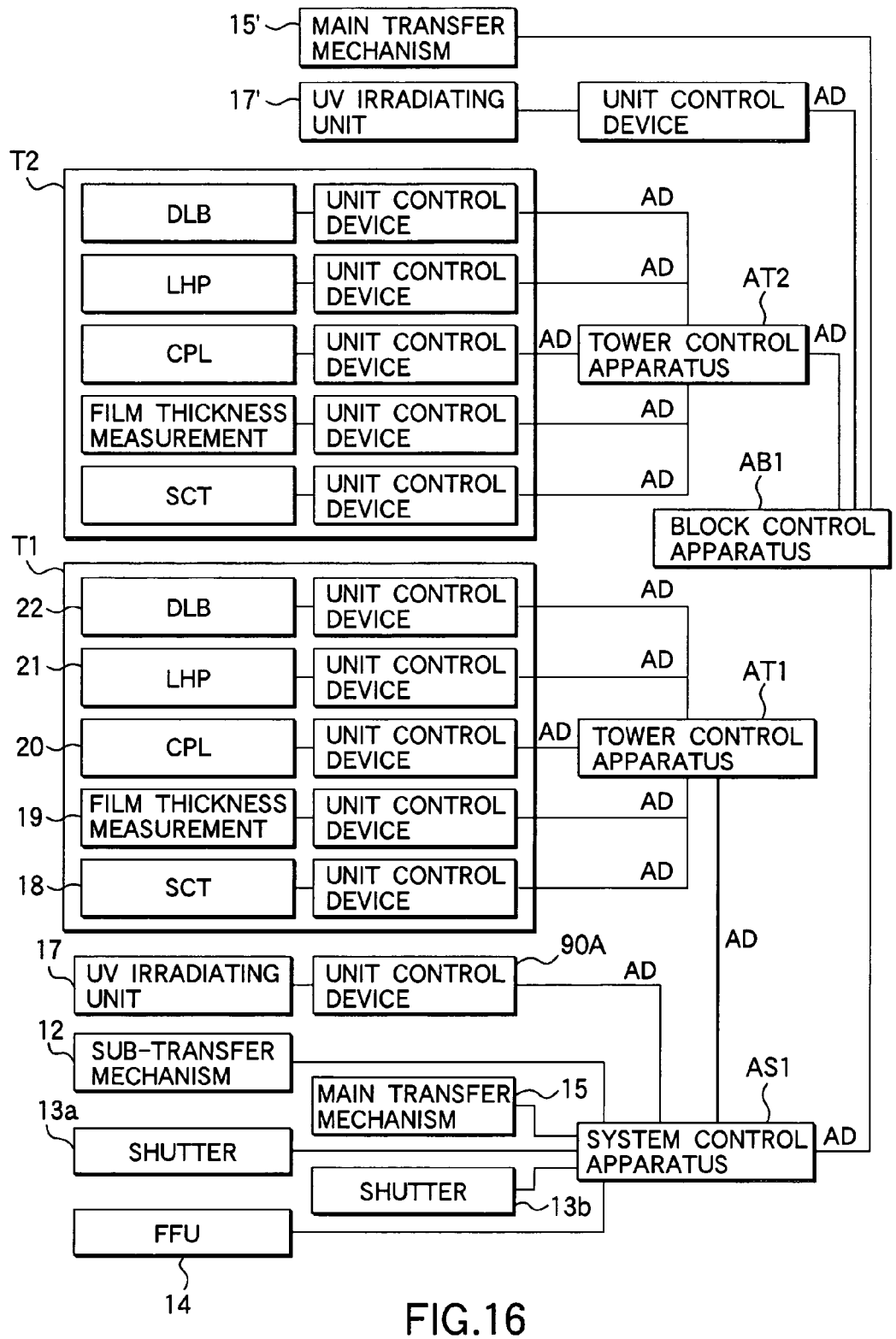
FIG. 16 schematically illustrates the control mode of the SOD system shown in FIG. 15.

FIG. 16 shows the control system of the SOD system 100B. A tower control apparatus AT2 is equal in construction to the tower control apparatus AT1 described previously and controlling the process tower T2. If the tower control apparatus AT2 is connected to a block control apparatus AB1 for controlling the additional process block 9, the block control apparatus AB1 automatically recognizes the unit information on each of the various process units arranged within the process tower T2. Also, the unit control device for the UV irradiating unit (DVT) 17' is connected directly to the block control apparatus AB1. As a result, the block control apparatus AB1 prepares a process recipe in the additional process block 9. The control device for the main transfer mechanism 15' is also connected directly to the block control apparatus AB1. When the block control apparatus AB1 is connected to the system control apparatus AS1, the system control apparatus AS1 automatically recognizes the installation of the additional process block 9 and prepares the recipe for the transfer and processing of the wafer W in the entire SOD system 100B. As described above, the control system in view of the installation of the additional process block 9 can be constructed easily in the SOD system 100B.

In the SOD system 100B, it is possible for the wafers W housed in, for example, the first carrier C1 to be processed in the process tower T1 and for the wafers W housed in the second carrier C2 to be processed in the process tower T2. In this case, it is possible for the same kind of the insulating films or for the different kinds of insulating films to be formed in the process tower T1 and the process tower T2. Further, it is possible for a first insulating film to be formed in the process tower T1 and for a second insulating film to be formed on the first insulating film in the process tower T2. In this case, it is possible for the first insulating film and the second insulating film to be the insulating films of the same kind or the different kinds. In the case of forming an insulating film of a two-layer structure, the wafer W is processed in the UV irradiating unit (DVT) 17•17' immediately before the wafer W is coated with the chemical liquid for forming the second insulating film. Incidentally, where different kinds of insulating films are formed in the process tower T1 and the process tower T2, it is possible to change the construction of the process units arranged in each of the process towers T1 and T2.

The SOD system 100B makes it possible to install additional facilities while utilizing the SOD system 100A constructed in advance. For example, where it is necessary to reinforce the facilities for increasing the amount of production, it is not advisable to newly install the SOD system 100A because the new installation is markedly disadvantageous in cost and footprint. However, in the case of preparing the SOD system 100B by installing the additional process block 9 in the SOD system 100A, it is possible to suppress the increase in the footprint and the increase in the facility cost. In addition, it is possible to increase the processing capacity of the wafer W.

Figure 17:
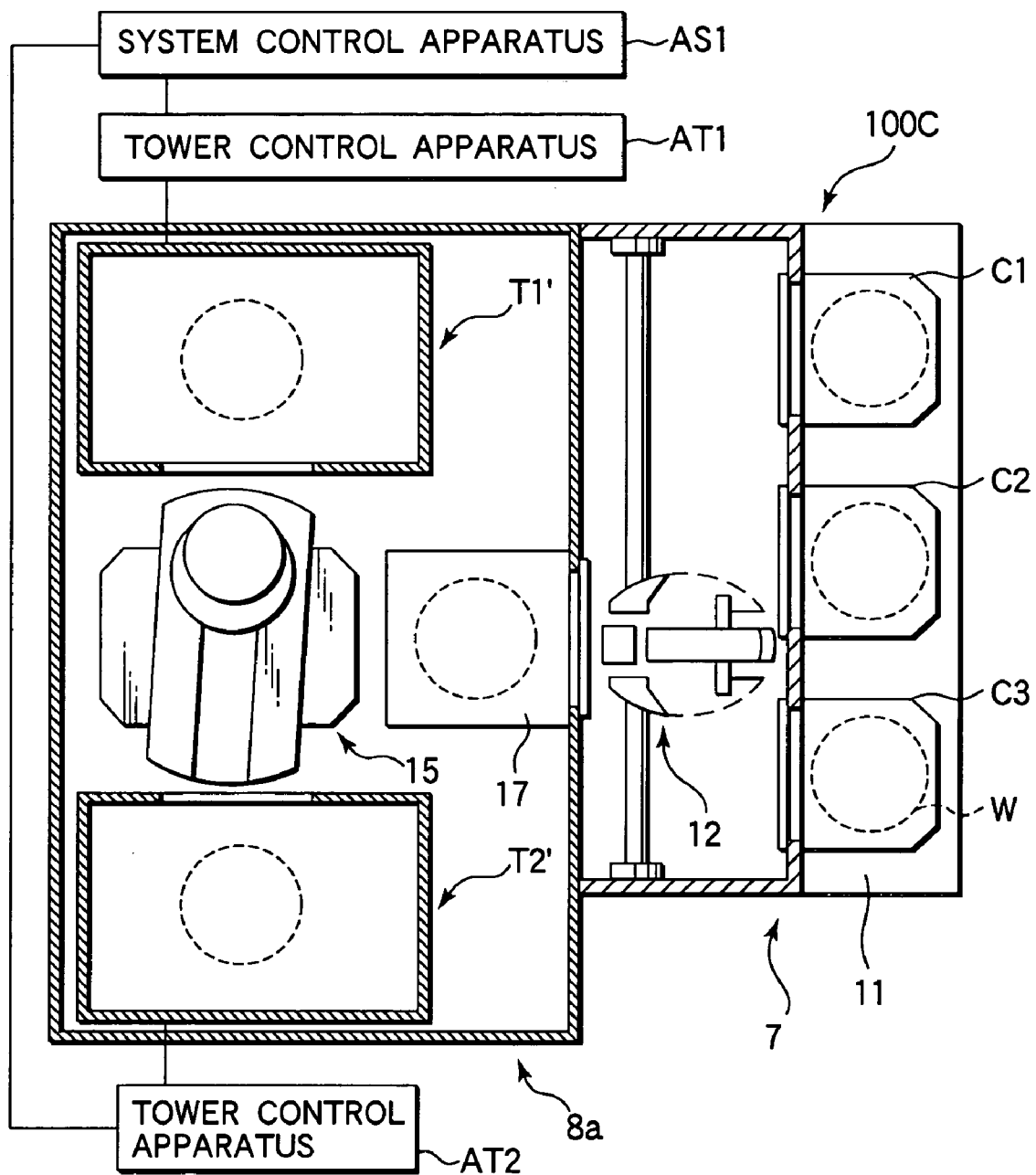
FIG. 17 is a horizontal cross sectional view schematically showing the construction of another SOD system.

FIG. 17 is a horizontal cross sectional view schematically showing the construction of another SOD system 100C. The SOD system 100C includes a process block 8a in which process towers T1' and T2' are arranged in a manner to have the main transfer mechanism 15 sandwiched therebetween. In the SOD system 100C, the wafer W is transferred into and out of each of the two process towers T1' and T2' by using the main transfer mechanism 15 alone so as to increase the transfer through-put. The SOD system 100C is also advantageous in that the footprint is smaller than that of the SOD system 100B described previously.

Figure 18:
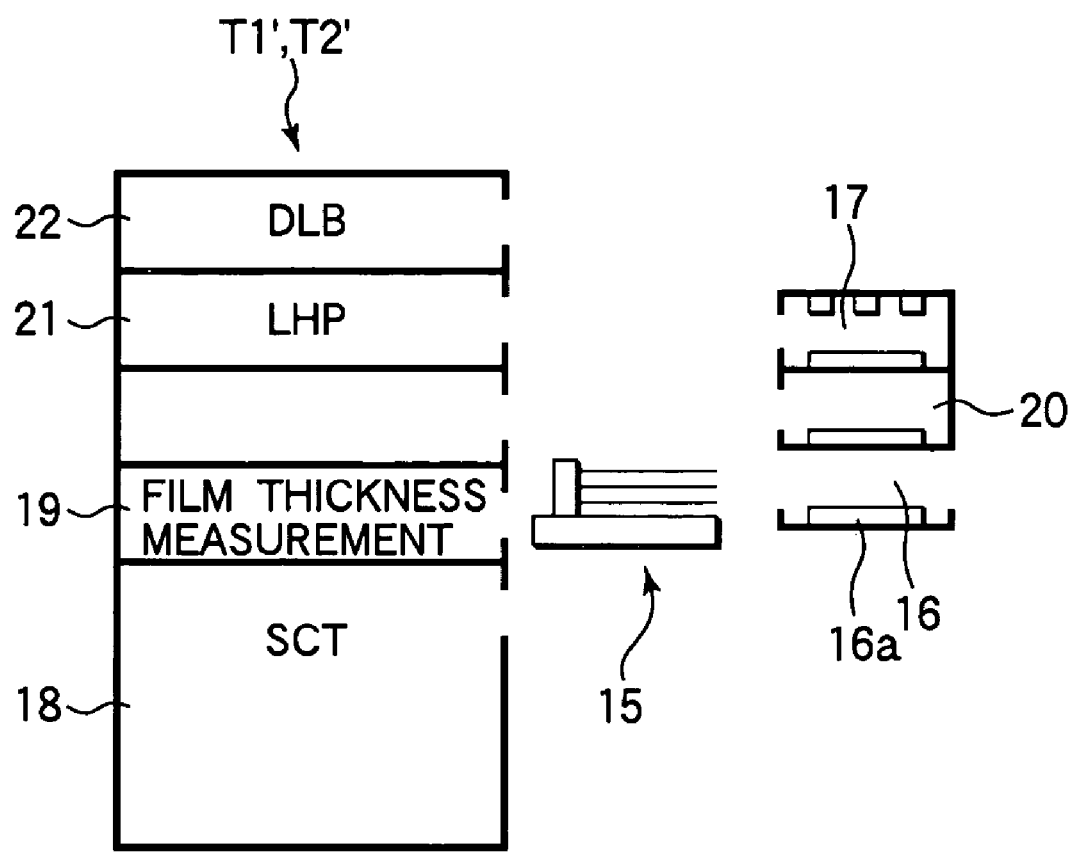
FIG. 18 schematically illustrates the construction of the process block included in the SOD system shown in FIG. 15.

FIG. 18 schematically shows the construction of the process block 8a included in the SOD system 100C. As shown in the drawing, the temperature control unit (CPL) 20 included in the process block 8a is not arranged in any of the process towers T1' and T2', but is arranged intermediate between the delivery unit (TRS) 16 and the UV irradiating unit (DVT) 17.

The wafer W controlled at a prescribed temperature in the temperature control unit (CPL) 20 is transferred into the coating unit (SCT) 18 arranged in each of the process towers T1' and T2'. In this fashion, the temperature control unit (CPL) 20 is used commonly in the process towers T1' and T2' in this embodiment. It should be noted in this connection that, before the step of coating the wafer W with the chemical liquid in the coating unit (SCT) 18 for forming an insulating film, the wafer W is controlled at a prescribed temperature (e.g., 23° C.) in the temperature control unit (CPL) 20. The wafer W can be controlled constant at a prescribed temperature in the temperature control unit (CPL) 20 regardless of the kind of the chemical liquid used. Such being the situation, the temperature control unit (CPL) 20 can be commonly used for the process towers T1' and T2' as pointed out above.

Incidentally, it is possible to form a delivery stage 16a, which is also capable of performing the function of the temperature control unit (CPL) 20, in the transfer unit (RRS) 16. In this case, the wafer W having the temperature controlled in the delivery stage 16a is transferred into the process tower T1' or the process tower T2'. It is also possible to arrange a plurality of temperature control units (CPL) 20 in the delivery unit (TRS) 16.

The processing method of the wafer W in the SOD system 100C is substantially equal to that in the SOD system 100B described previously and, thus, the description thereof is omitted. Prescribed process units as required can be arranged appropriately in the space within each of the process towers T1' and T2'. It is also possible to arrange as auxiliary process units the baking process unit (DLB) 22, etc. that are not used in general.

Figure 19:
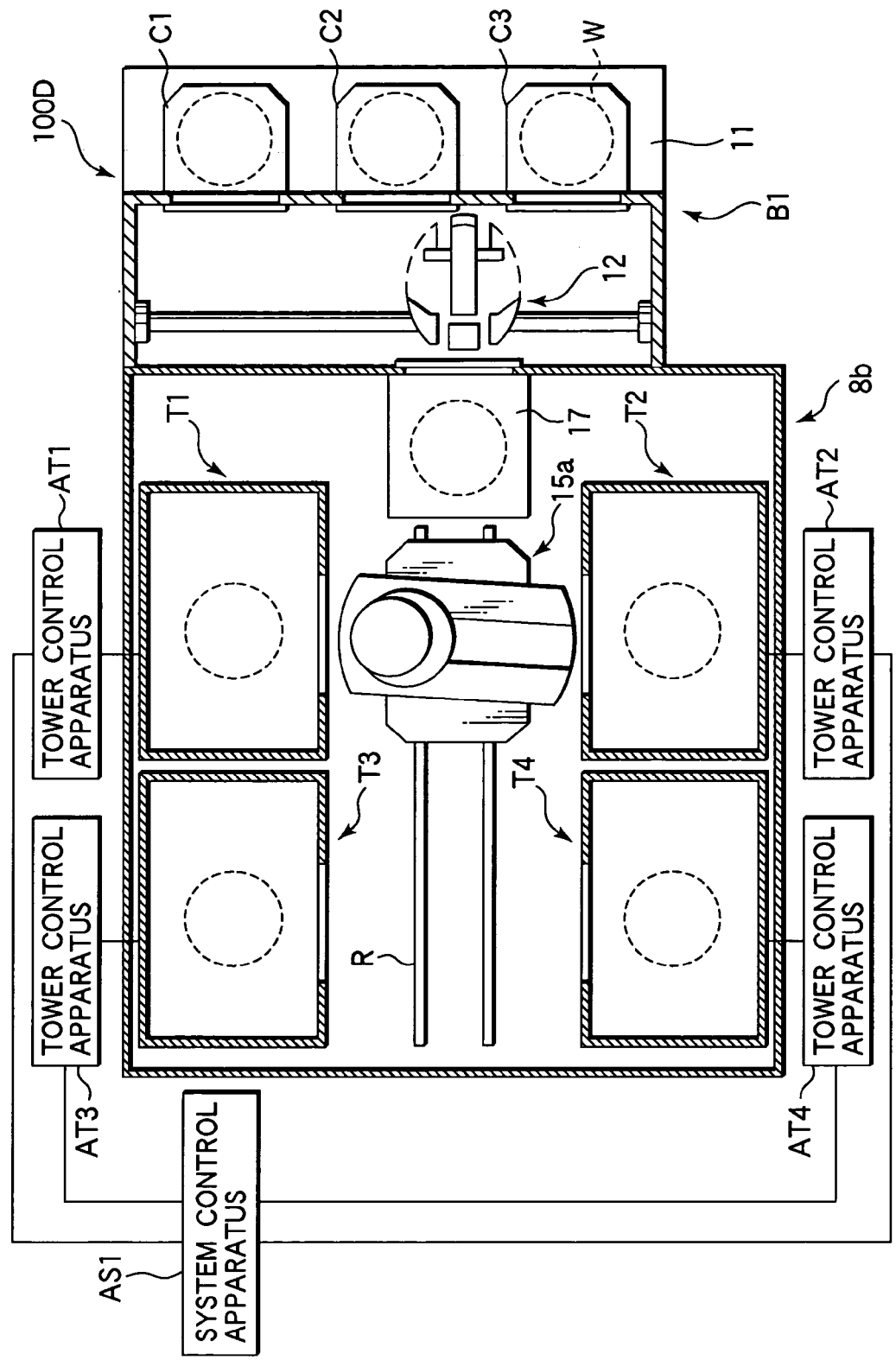
FIG. 19 is a horizontal cross sectional view schematically showing the construction of another SOD system.

FIG. 19 is a horizontal cross sectional view schematically showing the construction of an SOD system 100D. As shown in the drawing, four process towers T1 to T4 are arranged within a process block 8b of the SOD system 100D in a manner to surround a main transfer mechanism 15a. The main transfer mechanism 15a is substantially equal in construction to the main transfer mechanism 15 arranged in the SOD system 100A, except that the mechanism 15a is slidable in the X-direction along a rail R. It follows that it is possible for the main transfer mechanism 15a, which is slidable, to transfer the wafer W into and out of each of the process units arranged in each of the process towers T1 to T4.

In the SOD system 100D, the process units required for forming an insulating film of a single layer structure on the wafer W are arranged in combination within each of the four process towers T1 to T4. Also, tower control apparatuses AT1 to AT4 are connected to the process towers. T1 to T4, respectively, so as to permit the processing to be controlled individually for each of the process towers T1 to T4.

It is possible for the same kind of insulating films or different kinds of insulating films to be formed in the process towers T1 to T4. It is also possible to form successively four insulating films such that a first insulating film is formed in the process tower T1, followed by forming a second insulating film on the first insulating film in the process tower T2 and subsequently forming a third insulating film on the second insulating film in the process tower T3 and finally forming a fourth insulating film on the third insulating film in the process tower T4. Further, it is possible to transfer a single wafer W into each of the process towers T1 and T2 for forming a first insulating film on the wafer W, followed by transferring the wafer W having the first insulating film formed thereon into each of the process towers T3 and T4 for forming a second insulating film on the first insulating film.

In the SOD system 100D, the main transfer mechanism 15a is commonly used for transferring the wafer W into and out of each of the four process towers T1 to T4 so as to make it possible to diminish the footprint, compared with the case where the main transfer mechanism 15 is arranged for each process tower. Also, it is possible for the SOD system 100D to perform various processing for forming, for example, an insulating film of a single layer structure, a two-layer structure or a four-layer structure, as described above.

Figure 20:
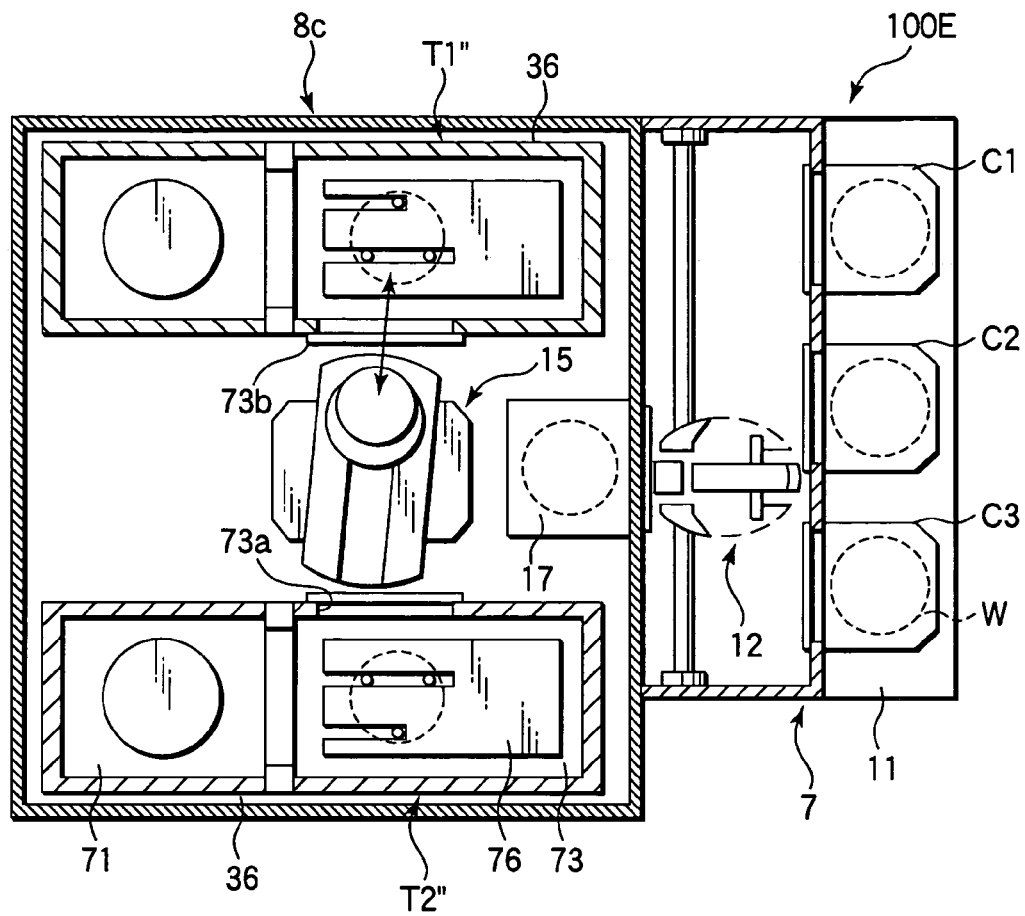
FIG. 20 is a horizontal cross sectional view schematically showing the construction of another SOD system.
Figure 21:
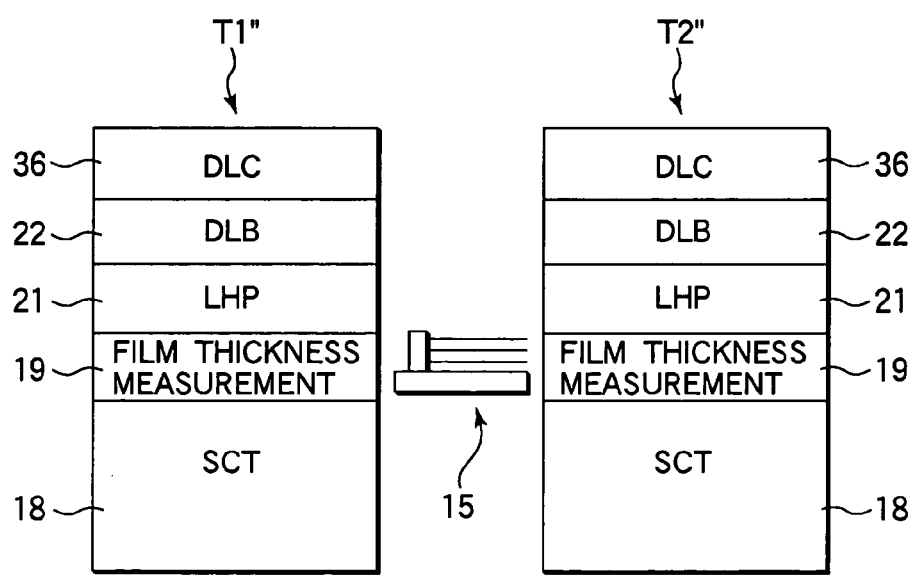
FIG. 21 is a back view schematically showing the construction of the SOD system shown in FIG. 20.

FIG. 20 is a horizontal cross sectional view schematically showing the construction of an SOD system 100E, and FIG. 21 is a back view schematically showing the construction of the SOD system 100E. As shown in the drawings, the SOD system 100E comprises a process block 8c having process towers T1" and T2" arranged therein. Each of these process towers T1" and T2" includes a coating unit (SCT) 18, a film thickness measuring unit 19, a low temperature heating unit (LHP) 21, a baking unit (DLB) 22, and a curing unit (DLC) 36 for performing a curing processing after the baking processing. These process units are stacked one upon the other in the order mentioned so as to form each of the process towers T1" and T2".

Figure 22:
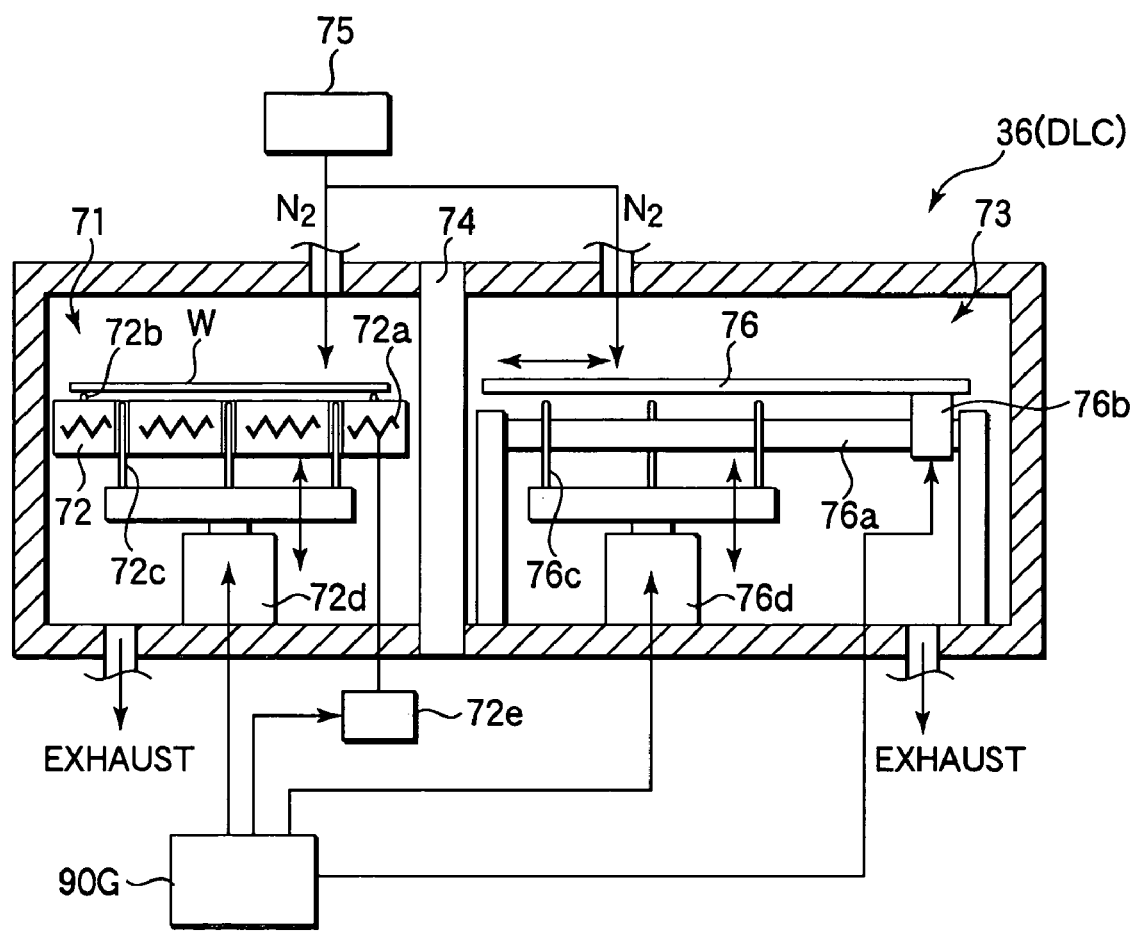
FIG. 22 is a cross sectional view schematically showing the construction of a curing unit.

FIG. 22 is a cross sectional view schematically showing the construction of the curing unit (DLC) 36. As shown in the drawing, the curing unit (DLC) 36 includes a heating chamber 71 and a temperature control process chamber 73 positioned adjacent to the heating chamber 71. The temperature control process chamber 73 also acts as a load lock chamber. A gate valve 74, which can be opened or closed, for performing the delivery of the wafer W is formed between the heating chamber 71 and the temperature control process chamber 73.

A heating plate 72 is arranged within the heating chamber 71. A heater 72a having an electric power supplied from a power supply section 72e is buried in the heating plate 72 so as to set the temperature of the heating plate 72 at, for example, 200° C. to 450° C. A proximity pin 72b for supporting the wafer W in a region close to the surface of the heating plate 72 is formed on the surface of the heating plate 72. Also, a lift pin 72c for moving the wafer W in the vertical direction above the heating plate 72 is formed to extend through the heating plate 72. The lift pin 72c is driven by a lift mechanism 72d.

A movable temperature control plate 76 holding the wafer W for controlling the temperature of the wafer W at, for example, 20° C. to 35° C. and a lift pin 76c are arranged within the temperature control process chamber 73. The temperature control plate 76 can be moved by a moving mechanism 76b along a guide rail 76a toward and away from the heating chamber 71. Also, the lift pin 76c can be moved in the vertical direction by a lift mechanism 76d so as to permit the wafer W on the movable temperature control plate 76 to be moved in the vertical direction. The wafer W is transferred between the main transfer mechanism 15 and the curing unit (DLC) 36 through a wafer transfer port 73a (see FIG. 20) on the side of the temperature control process chamber 73. The wafer transfer port 73a is opened and closed by a shutter 73b (see FIG. 20).

A nitrogen gas ($N_2$) is supplied from a nitrogen gas supply mechanism 75 into each of the heating chamber 71 and the temperature control process chamber 73. On the other hand, it is possible to exhaust the heating chamber 71 and the temperature control process chamber 73 by using an exhaust apparatus such as a vacuum pump (not shown).

In the curing unit (DLC) 36, it is possible to lower the oxygen concentration and to lower the pressure within the heating chamber 71 by supplying a $N_2$ gas from the nitrogen gas supply mechanism 75 into the heating chamber 71 while exhausting the atmosphere in the heating chamber 71. The wafer W transferred by the main transfer mechanism 15 into the temperature control process chamber 73 through the wafer transfer port 73a of the temperature control process chamber 73 is received by the lift pin 76c and, then, the wafer W is disposed on the movable temperature control plate 76. Then, a $N_2$ gas is supplied from the nitrogen gas supply mechanism 75 into the temperature control process chamber 73 while discharging the atmosphere from within the temperature control process chamber 73 so as to lower the oxygen concentration and to lower the pressure within the temperature control process chamber 73. Further, the gate valve 74 is opened so as to move the temperature control plate 76 into the heating chamber 71, and the wafer W is delivered from the temperature control plate 76 onto the lift pin 72c. When the temperature control plate 76 is brought back into the temperature control process chamber 73, the gate valve 74 is closed. On the other hand, the wafer W is disposed on the heating plate 72 by moving downward the lift pin 72c. Further, the atmosphere within the heating chamber 71 is adjusted again to have a prescribed reduced pressure having a prescribed low oxygen concentration, and the wafer disposed on the heating plate 72 is heated to a prescribed temperature so as to apply a prescribed curing processing to the wafer W. The wafer W after completion of the curing processing is delivered onto the movable temperature control plate 76 moved into the heating chamber 71 and, then, brought back into the temperature control process chamber 73 so as to have the wafer W controlled at a prescribed temperature. Further, the pressure inside the temperature control process chamber 73 is brought back to the normal pressure. Under this condition, the wafer transfer port 73a is opened so as to have the wafer W after the curing processing transferred out of the temperature control process chamber 73 by the main transfer mechanism 15.

A unit control device 90G permits controlling the various operations performed within the curing unit (DLC) 36 including, for example, the control of the power output from the power supply section 72e into the heater 72a (i.e., the temperature control of the heating plate 72), the vertical movement of each of the lift pins 72c and 76c, the opening-closing operation of the gate valve 74, the movement of the movable temperature control plate 76, and the degree of vacuum and the $N_2$ concentration within each of the heating chamber 71 and the temperature control process chamber 73. In the case of, for example, the process tower T1", the unit information on the curing unit (DLC) 36 is transmitted to the tower control apparatus AT1, if the unit control device 90G is connected to the tower control apparatus AT1. As a result, the tower control apparatus AT1 prepares a process recipe including the curing processing. Also, the tower control apparatus AT1 is capable of changing the control parameter of the curing unit (DLC) 36 into an appropriate value based on the result of the measurement of the film thickness performed in the film thickness measuring unit 19.

The SOD system 100E makes it possible to diminish in total the area required for installing the entire apparatus, compared with the case where the curing processing is carried out outside the SOD system, i.e., where the apparatus for the curing processing is installed separately from the SOD system. Also, since the transfer distance of the wafer W between the baking unit (DLB) 22 and the curing unit (DLC) 36 is shortened, it is possible to increase the transfer through-put.

Where, for example, two insulating films are formed successively on the wafer W by using the SOD system 100E, it is possible to have the processing for forming the first insulating film in the process tower T1' finished by the baking processing and to have the processing for forming the second insulating film in the process tower T2" finished by the curing processing. In this case, the first insulating film and the second insulating film are subjected to the curing processing simultaneously during the curing processing performed in the process tower T2". Such being the situation, it is not absolutely necessary to arrange the curing unit (DLC) 36 in the process tower T1".

Figure 23:
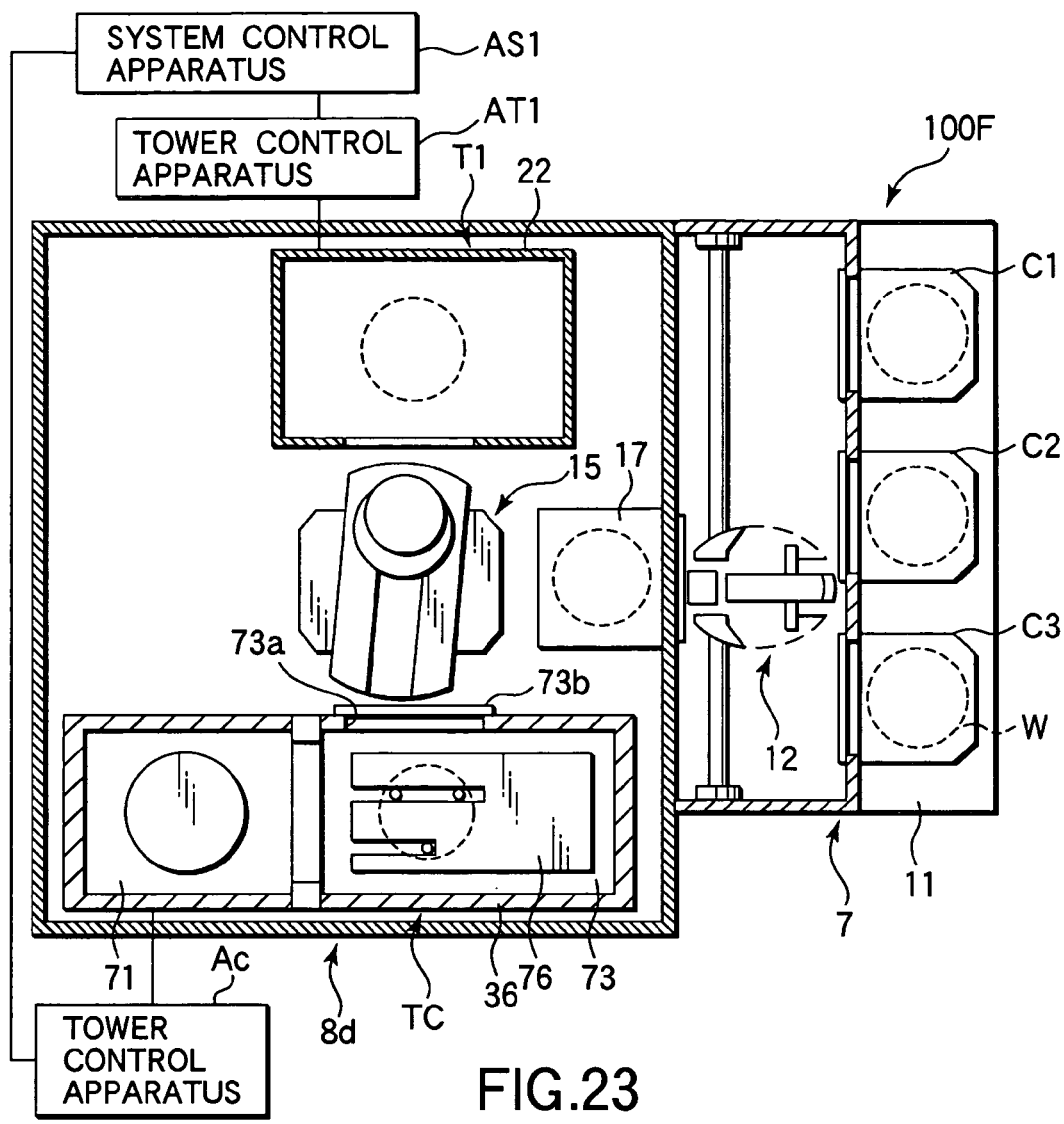
FIG. 23 is a horizontal cross sectional view schematically showing the construction of another SOD system.
Figure 24:
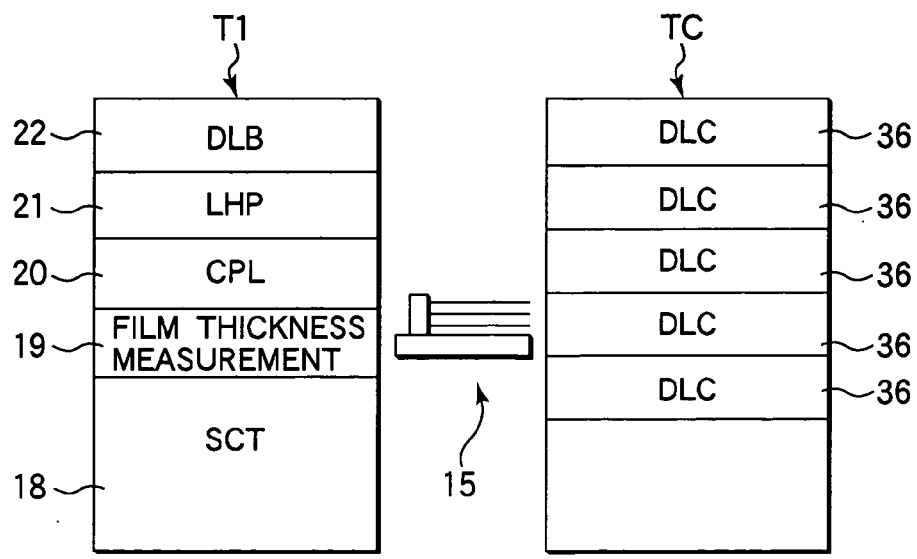
FIG. 24 is a back view schematically showing the construction of the SOD system shown in FIG. 23.

FIG. 23 is a horizontal cross sectional view schematically showing the construction of an SOD system 100F, and FIG. 24 is a back view schematically showing the construction of the SOD system 100F. As shown in the drawings, the SOD system 100F comprises a process block 8d prepared by modifying the process block 8a included in the SOD system 100C described previously. To be more specific, a curing process tower TC prepared by stacking a plurality of curing units (DLC) 36 one upon the other so as to form a multi-stage structure is arranged in the process block 8d in place of the process tower T2. The wafer W after completion of the baking processing performed in the process tower T1 is successively transferred by the main transfer mechanism 15 into any of the curing units (DLC) 36 arranged within the curing process tower TC so as to have a prescribed curing processing applied to the wafer W.

The curing process tower TC is controlled by a tower control apparatus Ac. When the tower control apparatus Ac is connected to the system control apparatus AS1, the system control apparatus AS1 recognizes the construction of the curing process tower TC and prepares a processing recipe of the wafer W in the SOD system 100F. The system control apparatus AS1 is capable of changing the control parameter of the curing unit (DLC) 36 into an appropriate value based on the result of the thickness measurement performed by the film thickness measuring unit 19.

The SOD system 100F comprises the curing unit (DLC) 36 like the SOD system 100E. Therefore, compared with the case where the curing process unit is installed separately from the SOD system, the transfer distance of the wafer W between the baking unit (DLB) 22 and the curing unit (DLC) 36 is short so as to increase the wafer transfer through-put. Also, since the plural curing units (DLC) 36 each requiring a high process temperature and a long process time are arranged separately from the other process units, it is possible to suppress the detrimental effect given from the curing units (DLC) 36 to the other process units.

Incidentally, it is possible to arrange, for example, a batch type heat processing furnace for subjecting, for example, 25 to 50 wafers to the curing processing simultaneously in place of the curing process tower TC.

For performing the curing processing required for forming an insulating film, it is possible to use an apparatus for performing the curing processing by using an electron beam, i.e., a so-called "EB curing unit", in place of the method described above in which the wafer W is subjected to a thermal process.

Figure 25:
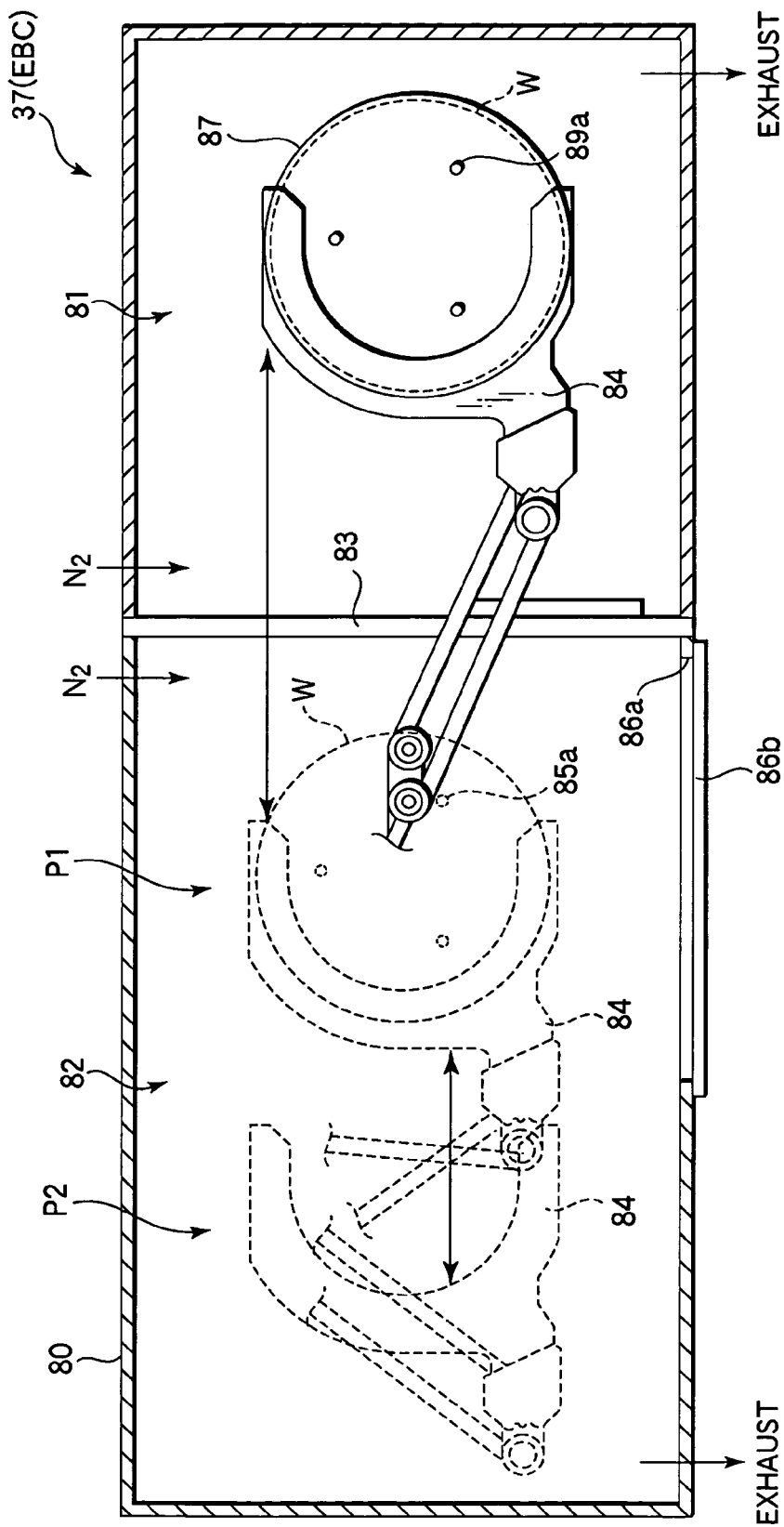
FIG. 25 is a horizontal cross sectional view schematically showing the construction of an EB curing unit.
Figure 26:
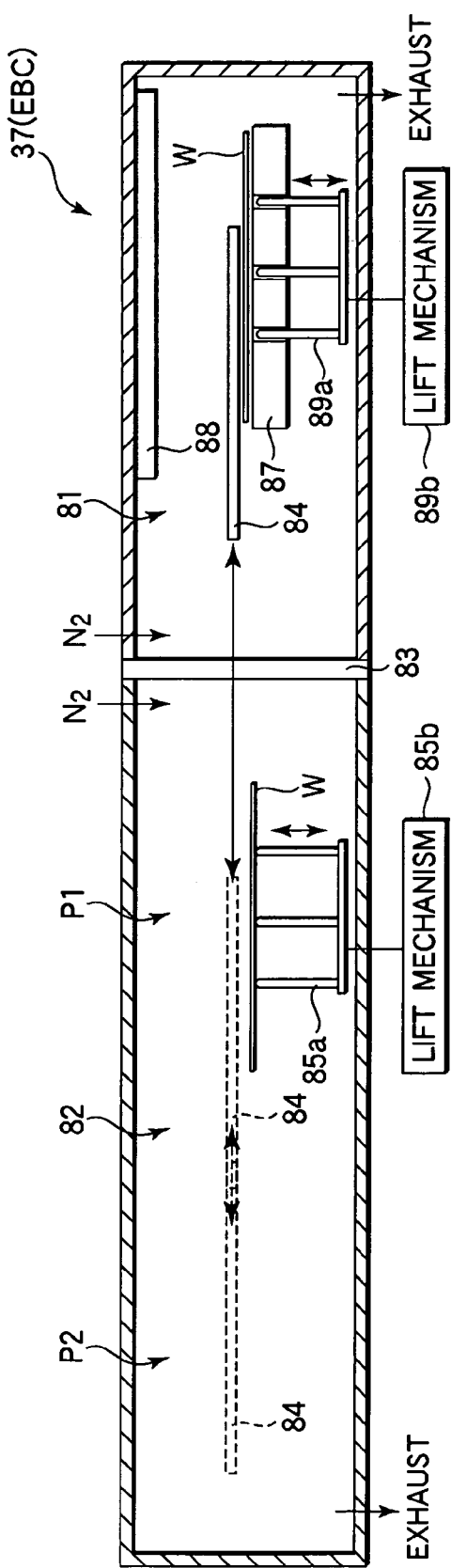
FIG. 26 is a vertical cross sectional view schematically showing the construction of the EB curing unit.

FIGS. 25 and 26 are a horizontal cross sectional view and a vertical cross sectional view, respectively, each schematically showing the construction of an EB curing unit (EBC) 37. As shown in the drawings, the EB curing unit (EBC) 37 comprises a casing 80. The casing 80 is partitioned by a gate valve 83 into an electron beam process chamber 81 and a wafer transfer chamber 82 that also acts as a load lock chamber. A $N_2$ gas is supplied from a nitrogen gas supply mechanism (not shown) into each of the electron beam process chamber 81 and the wafer transfer chamber 82. On the other hand, the atmosphere within the electron beam process chamber 81 and the wafer transfer chamber 82 can be exhausted by an exhaust apparatus (e.g., a vacuum pump).

An internal transfer arm 84 having a multi-joint structure is arranged within the wafer transfer chamber 82, though the joint portion is not shown in detail in the drawing. The wafer transfer chamber 82 can be roughly divided into a wafer delivery zone P1 and an arm retreating zone P2. The internal transfer arm 84 is movable between the wafer delivery zone P1 and the arm retreating zone P2 and between the arm retreating zone P2 and the electron beam process chamber 81. A lift pin 85a that can be moved by a lift mechanism 85b in the vertical direction is mounted within the wafer delivery zone P1. Also, a wafer transfer port 86a that can be opened and closed by a shutter 86b is formed in the wafer transfer chamber 82 on the side of the wafer delivery zone P1.

Figure 27:
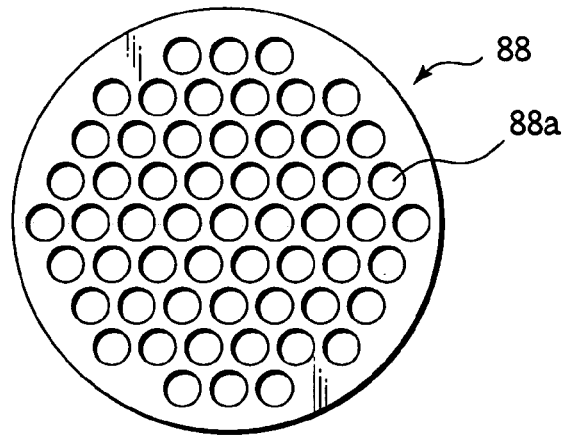
FIG. 27 is a plan view showing the construction of an electron beam irradiating apparatus.

Arranged within the electron beam process chamber 81 are a stage 87 for mounting the wafer W thereon, an electron beam generating device 88 for irradiating the wafer W disposed on the stage 87 with an electron beam, and a lift pin 89a that can be moved in the vertical direction by a lift mechanism 89b. FIG. 27 is a plan view showing the construction of the electron beam irradiating device 88. As shown in the drawing, a plurality of electron beam irradiating tubes 88a are arranged in a high density within a circular region having a prescribed diameter so as to form the electron beam irradiating device 88. Incidentally, it is possible to arrange on the stage 87 a temperature control device for controlling the wafer W at a desired temperature.

In the EB curing unit (EBC) 37 of the construction described above, a $N_2$ gas atmosphere of the normal pressure is set up first within the wafer transfer chamber 82 and, then, the shutter 86b is driven so as to open the wafer transfer port 86a under the state that the internal transfer arm 84 is retreated into the arm retreating zone P2. Then, the arm 61 holding the wafer W after completion of the baking processing is moved into the wafer delivery zone P1 through the wafer transfer port 86a, followed by moving upward the lift pin 85a. As a result, the wafer W is held by the lift pin 85a. After the arm 61 has been retreated, the wafer transfer port 86a is closed so as to set up an atmosphere of a reduced pressure having a prescribed oxygen concentration within each of the wafer transfer chamber 82 and the electron beam process chamber 81. Then, the internal transfer arm 84 is moved into the wafer delivery zone P1, and the lift pin 85a is moved downward so as to permit the wafer W to be held by the internal transfer arm 84. Further, the gate valve 83 is opened and the internal transfer arm 84 is moved into the electron beam process chamber 81, followed by moving upward the lift pin 89a. As a result, the wafer W is delivered from the internal transfer arm 84 onto the lift pin 89a. In the next step, the internal transfer arm 84 is brought back into the wafer transfer chamber 82, and the lift pin 89a is moved downward so as to permit the wafer W to be disposed on the stage 87. After a prescribed vacuum atmosphere is set up within the electron beam process chamber 81, the electron beam generating device 88 is operated so as to irradiate the wafer W with an electron beam, thereby carrying out a curing processing. Incidentally, it is desirable to introduce a process gas such as an argon gas and a methane gas into the electron beam process chamber 81 during the curing processing in order to cool the electron beam irradiating tube 88*a* and to promote the process reaction.

After the curing processing, the process gas is exhausted from the electron beam process chamber 81, and a $N_2$ gas is supplied into the electron beam process chamber 81 so as to cause the wafer transfer chamber 82 and the electron beam process chamber 81 to be equal to each other in the internal atmosphere. Under this condition, the gate valve 83 is opened, and the internal transfer arm 84 is allowed to hold the wafer W by the procedures opposite to those for allowing the wafer W to have been disposed on the stage 87 previously. Then, the internal transfer arm 84 is moved into the wafer delivery zone P1 within the wafer transfer chamber 82 so as to deliver the wafer W onto the lift pin 85*a*. After delivery of the wafer W, the internal transfer arm 84 is retreated into the arm retreating zone P2, and the wafer transfer port 86*a* is opened so as to move the arm 61 not holding the wafer W into the wafer delivery zone P1. Then, the wafer W is delivered onto the arm 61. Where the wafer W that is to be subjected to the curing processing in the next step is held by another arm 61, the wafer W is transferred into the wafer delivery zone P1 and, then, the wafer W is transferred within the EB curing unit (EBC) 37 so as to receive the curing processing.

It is possible to install the EB curing unit (EBC) 37 (or curing unit (DLC) 36) within any of the SOD systems 100A to 100D described previously as an additional facility. It is also possible to replace the curing unit (DLC) 36 included in any of the SOD systems 100E and 100F by the EB curing unit (EBC) 37.

Figure 28:
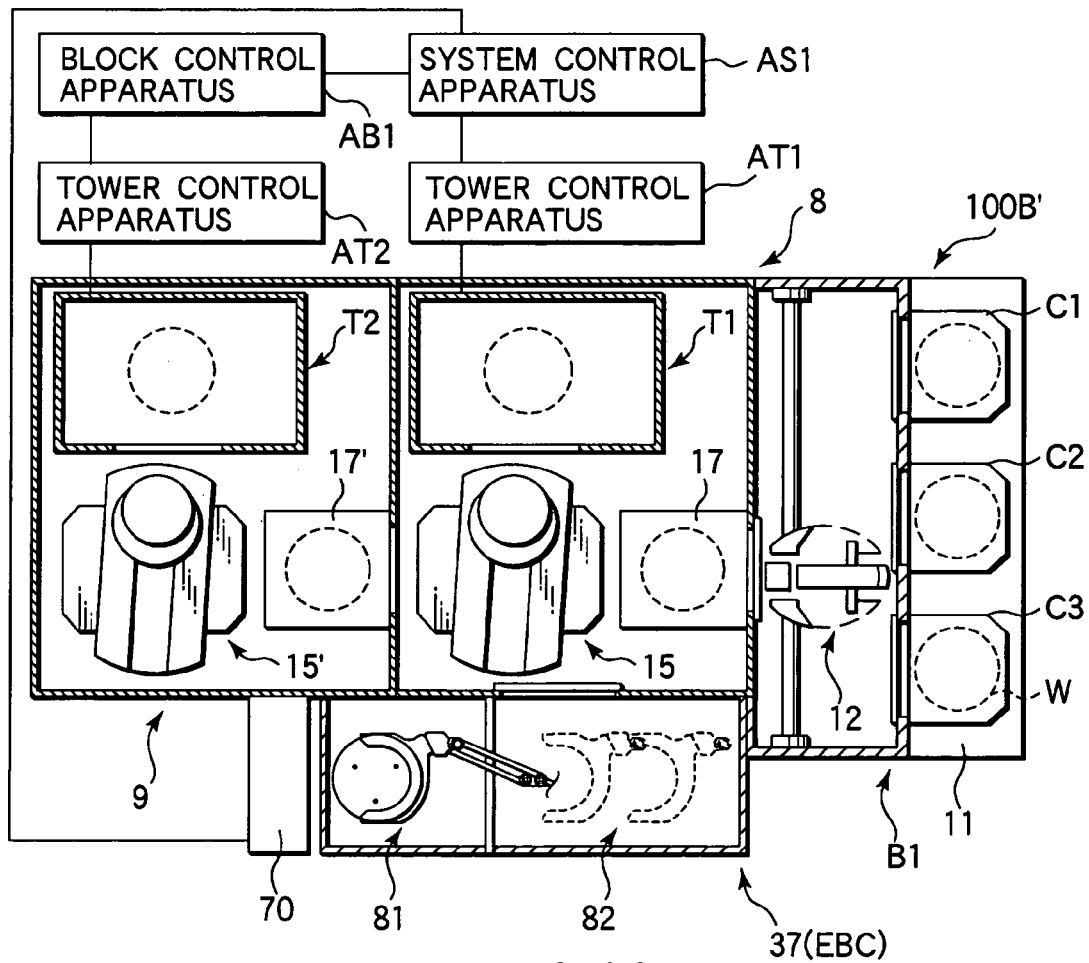
FIG. 28 is a horizontal cross sectional view schematically showing the construction of another SOD system.

FIG. 28 is a horizontal cross sectional view schematically showing the construction of an SOD system 100B', which is prepared by adding the EB curing unit (EBC) 37 to the SOD system 100B described previously. In the SOD system 100B', an electric unit 70 is arranged adjacent to the EB curing unit (EBC) 37. Various control devices for controlling the EB curing unit (EBC) 37 such as the control device for controlling the power source of the electron beam generating device 88, the control device for controlling the temperature of the stage 87 and the control device for controlling the internal transfer arm 84 are mounted within the electric unit 70.

When the electric unit 70 positioned adjacent to the EB curing unit (EBC) 37 is connected to the system control apparatus AS1, the system control apparatus AS1 grasps the unit construction, etc. of the entire SOD system 100B' so as to prepare the process recipe and the transfer recipe of the wafer W within the entire SOD system 100B'. In the SOD system 100B', the main transfer mechanism 15 performs the delivery of the wafer W after completion of the baking processing within the process towers T1 and T2 onto the wafer delivery zone P1 of the EB curing unit (EBC) 37.

In the SOD system 100B', the EB curing unit (EBC) 37 is arranged outside the system, with the result that the maintenance can be performed easily when the EB curing unit (EBC) 37 have got out of order.

Incidentally, it is possible for the EB curing unit (EBC) 37 to be of a multi-stage stacked structure. The arranging position of the EB curing unit (EBC) 37 is not limited to the position shown in FIG. 28. It is also possible to arrange the EB curing unit (EBC) 37 in the position where the main transfer mechanism 15' is capable of delivering the wafer W to the wafer delivery zone P1 within the EB curing unit (EBC) 37. For example, it is possible to arrange the EB curing unit (EBC) 37 on the left side of the additional process block 9 shown in FIG. 28. Further, it is possible to arrange two EB curing units (EBC) 37, one in the position shown in FIG. 28 and the other in the position on the left side of the additional process block 9.

Figure 29:
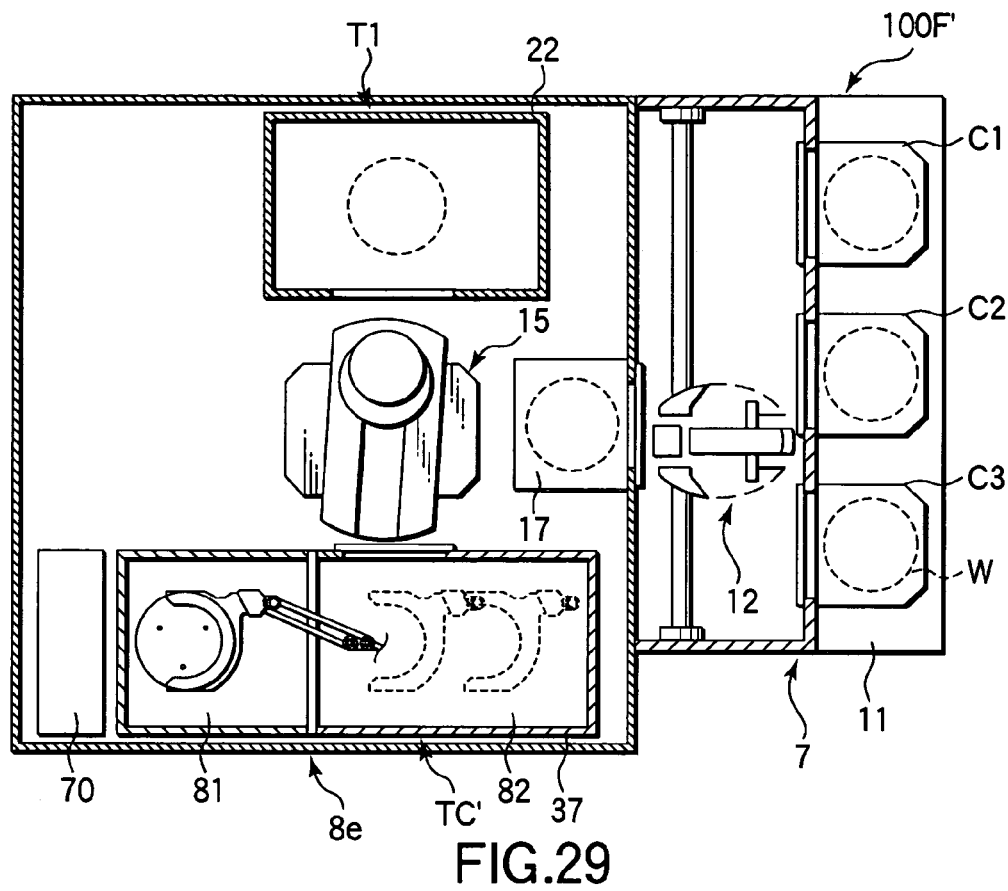
FIG. 29 is a horizontal cross sectional view schematically showing the construction of another SOD system.
Figure 30:
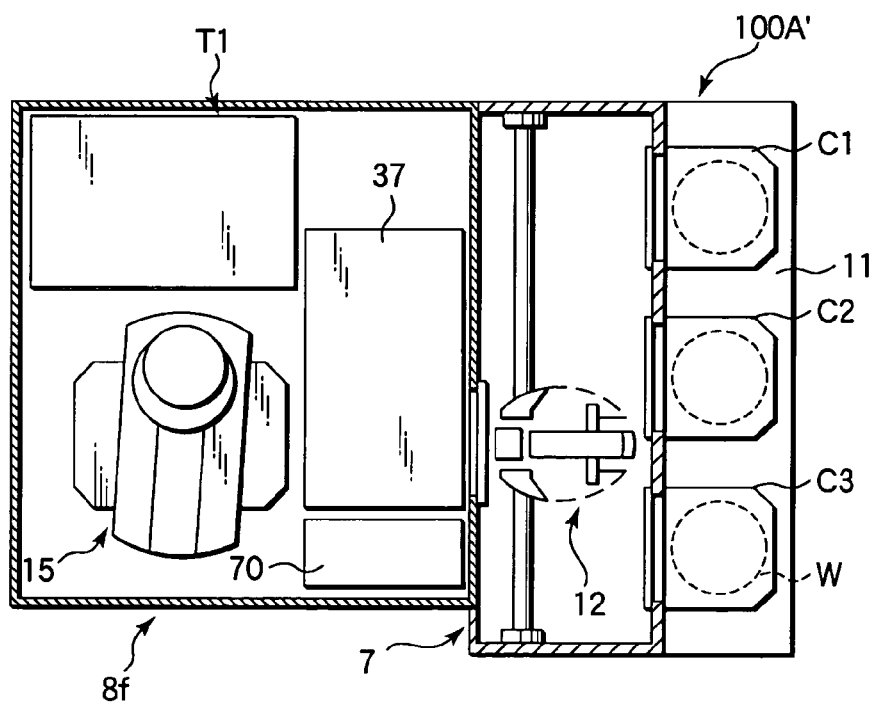
FIG. 30 is a horizontal cross sectional view schematically showing the construction of another SOD system.

FIG. 29 is a horizontal cross sectional view schematically showing the construction of an SOD system 100F'. The SOD system 100F' comprises a process block 8*e* prepared by modifying the process block 8*d* included in the SOD system 100F. To be more specific, an EB curing process tower TC' prepared by stacking two EB curing units (EBC) 37 one upon the other is arranged in the process block 8*e* included in the SOD system 100F' in place of the curing process tower TC arranged in the process block 8*d* included in the SOD system 100F. The EB curing process tower TC' is also detachable from the process block 8*e* like the process tower T1. Therefore, even where the EB curing unit (EBC) 37 has got out of order, the EB curing unit (EBC) 37 can be repaired easily by pulling the EB curing unit (EBC) 37 out from the process block 8*e*.

Where the EB curing unit (EBC) 37 is arranged within, for example, the process block 8 of the SOD system 100A, it is possible to arrange the EB curing unit (EBC) 37 on the upper side of the UV irradiating unit (DVT), as in an SOD system 100A' shown in FIG. 30. The UV irradiating unit (DVT) is not shown in FIG. 30. It is desirable for the EB curing unit (EBC) 37 to be detachable singly from a process block 8*f* in this case, too, so as to facilitate the maintenance of the EB curing unit (EBC) 37.

Where the EB curing unit (EBC) 37 is arranged in an SOD system as in the SOD systems 100A', 100B', and 100F', it is desirable to arrange the vacuum section (i.e., the casing 80) of the EB curing unit (EBC) 37 and the electric unit 70 a prescribed distance apart from each other in order to facilitate the maintenance of mainly the vacuum section (i.e., the electron beam process chamber 81 and the wafer transfer chamber 82) of the EB curing unit (EBC) 37.

The present invention is not limited to the embodiments described above. For example, it is possible to arrange a plurality of baking units (DLB) 22 within the process tower T1 of the SOD system 100A without arranging the low temperature heating unit (LHP) 21 within the process tower T1. In this case, the drying processing and the baking processing of the coating film are consecutively carried out in the plural baking units (DLB) 22.

Figure 31:
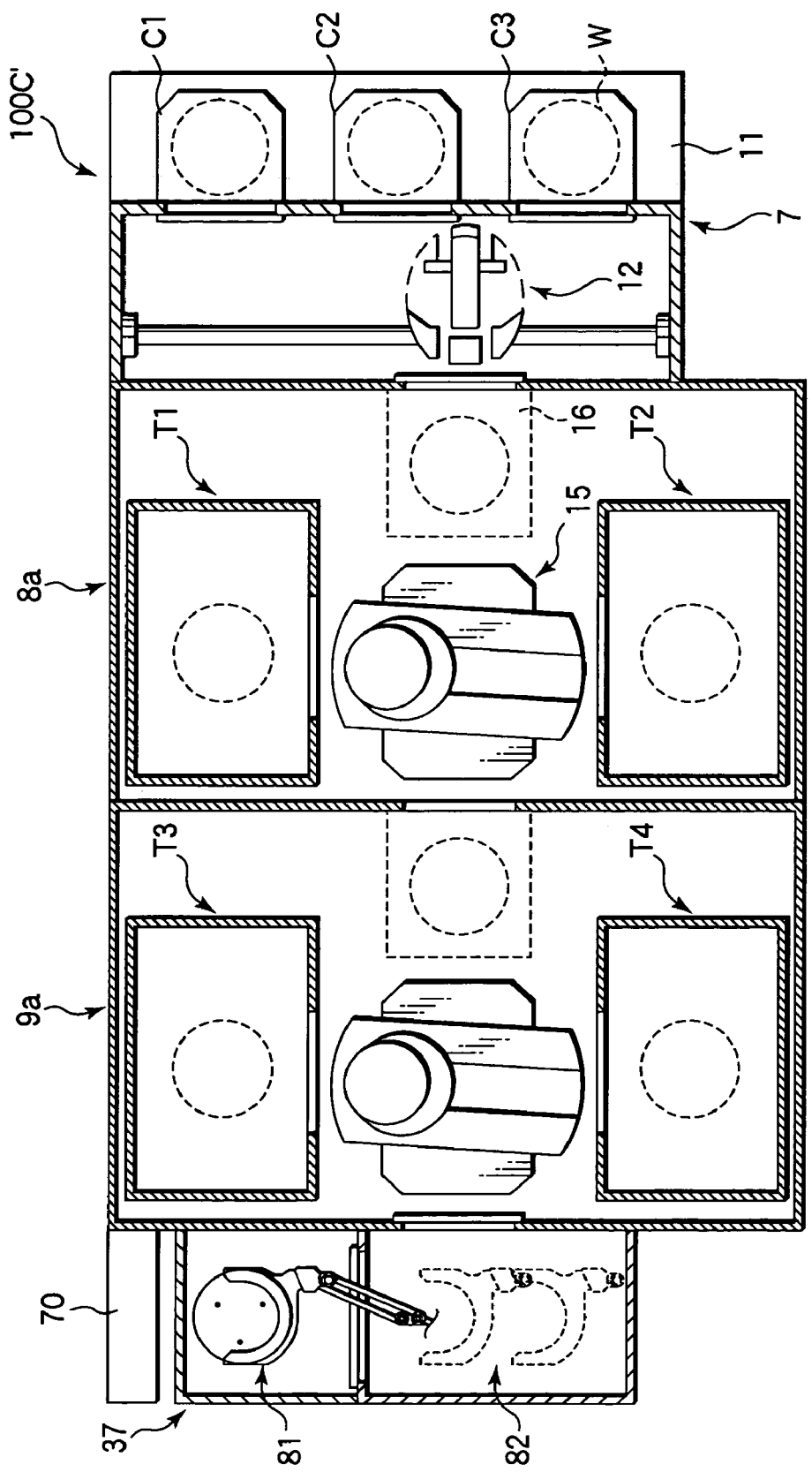
FIG. 31 is a horizontal cross sectional view schematically showing the construction of another SOD system.

Also, where the additional process block 9 that is similar in construction to the process block 8 is installed within the SOD system 100A together with the process block 8, the number of additional process blocks is not limited to one. As described previously, the SOD system 100B was prepared by installing the additional process block 9 similar in construction to the process block 8 within the SOD system 100A together with the process block 8. Likewise, the SOD system 100B' was prepared by further installing the EB curing unit (EBC) 37 within the SOD system 100B. In this fashion, it is possible to construct another effective SOD system 100C' by installing an additional process block 9*a*, which is similar in construction to the process block 8*a* installed within the SOD system 100C, and the EB curing unit (EBC) 37 within the SOD system 100C. FIG. 31 is a horizontal cross sectional view schematically showing the construction of the SOD system 100C' referred to above. Since the four process towers T1 to T4 are installed within the SOD system 100C', it is possible to process the wafer W based on the recipe similar to that for, for example, the SOD system 100D. In addition, the curing processing can be performed within the EB curing unit (EBC) 37.

Figure 32:
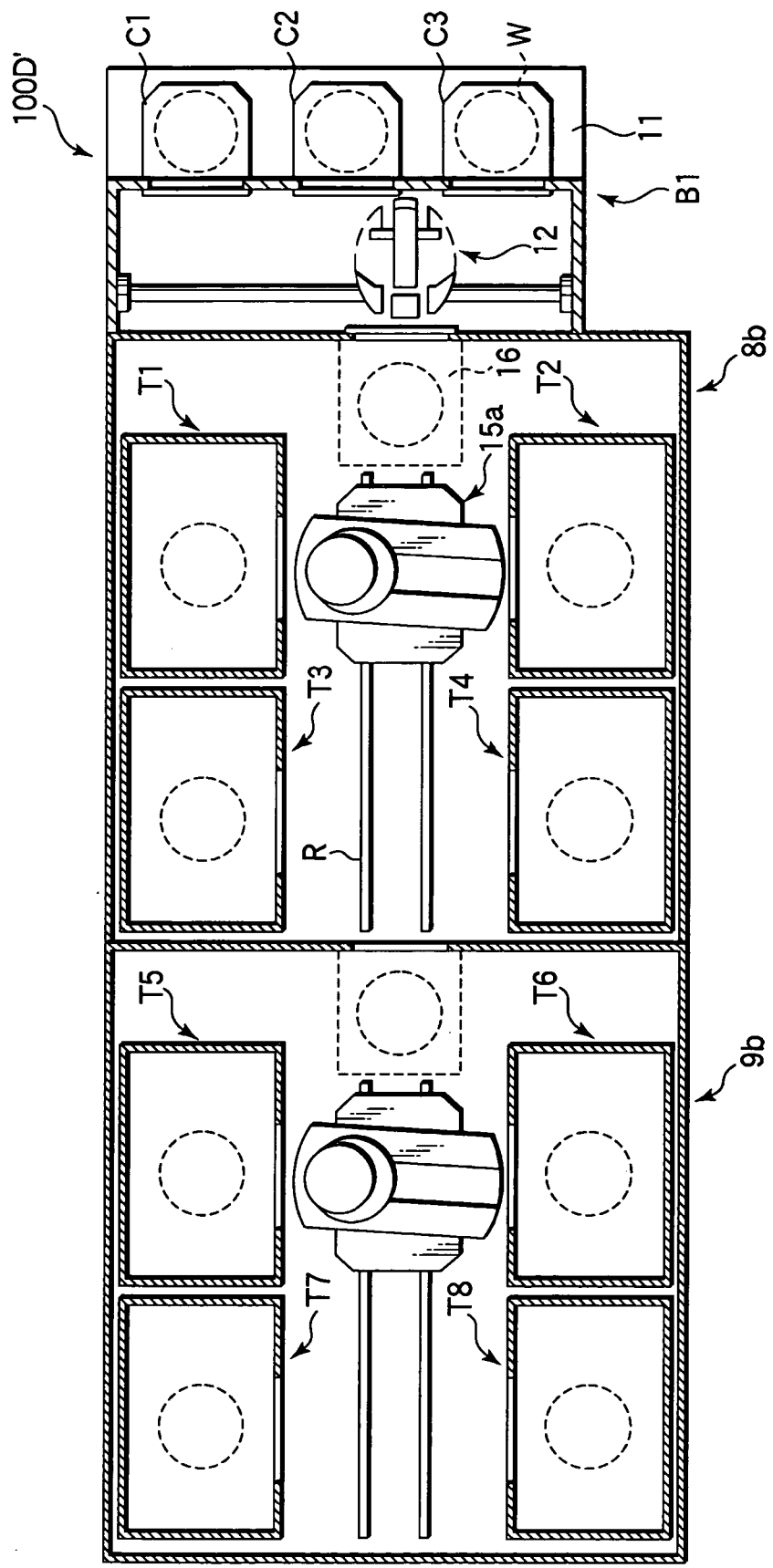
FIG. 32 is a horizontal cross sectional view schematically showing the construction of still another SOD system.

Likewise, an SOD system 100D' can be prepared by installing an additional process block 9*b*, which is similar in construction to the process block 8b installed within the SOD system 100D, within the SOD system 100D together with the process block 8b. FIG. 32 is a horizontal cross sectional view schematically showing the construction of the SOD system 100D' referred to above. In the SOD system 100D', it is possible to form the same kind or different kinds of insulating films on a single wafer W by operating the eight process towers T1 to T8. It is also possible to transfer a single wafer W into each of the process towers T1 to T8 so as to form an insulating film of a single layer structure on each of the eight wafers W. Further, it is possible to form a first insulating film on the wafer W in the process block 8b, followed by forming a second insulating film on the first insulating film in the additional process block 9b.

As apparent from the comparison among the SOD systems 100A, 100C and 100D, an optional number of process towers can be installed within the process block. Also, it is possible to construct a new SOD system equipped with six process towers by installing the additional process block 9b, which is similar in construction to the process block 8b included in the SOD system 100D, in the position adjacent to the process block 8a included in the SOD system 100C.

In the various SOD systems described above, it is possible to arrange an inspecting tower, which is prepared by stacking a plurality of film thickness measuring units 19, in place of the process tower. Also, it is possible for the tower control apparatus AT1 to be constructed to perform solely the function of generating an alarm in response to a prescribed abnormality without performing the function of correcting the control parameter of each of the process units constituting the process tower T1.

Further, depending on the SOD material used, it is necessary to carry out additional processing after the coating step such as the processing under an ammonia gas atmosphere and the chemical processing like the solvent exchange processing. Therefore, it is possible to mount an aging unit, a solvent exchange unit, etc. in the process tower.

Figure 33:
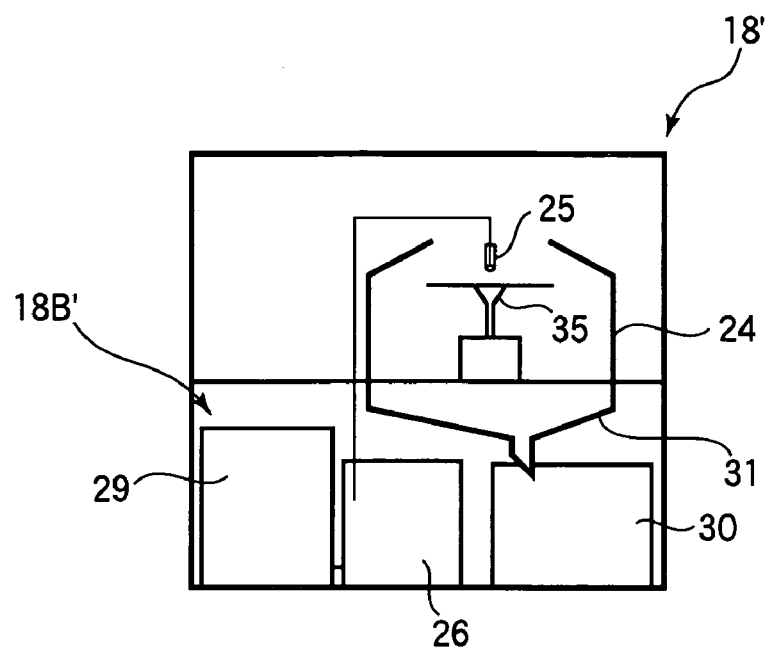
FIG. 33 schematically illustrates the construction of another coating unit.
Figure 34:
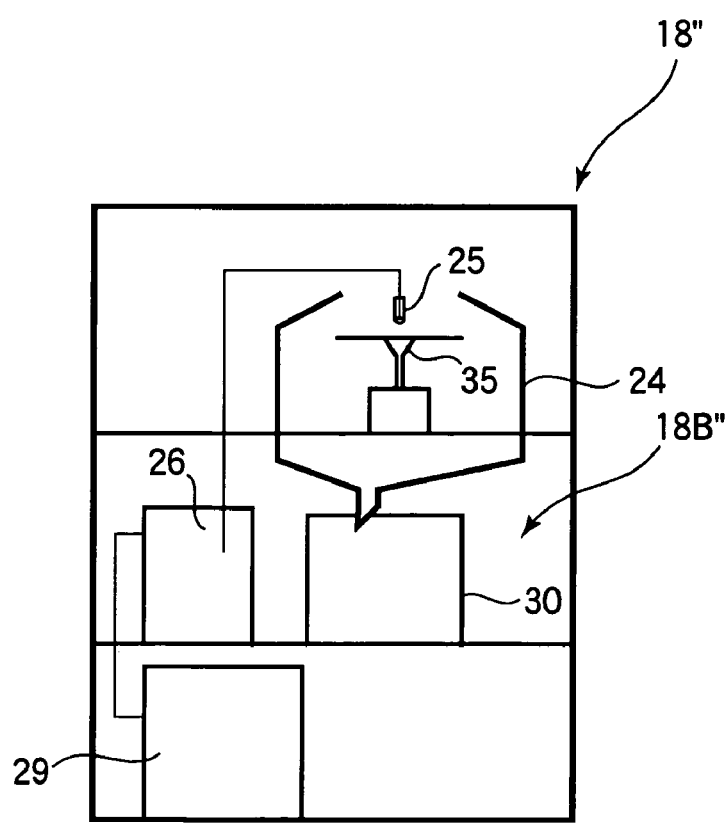
FIG. 34 schematically illustrates the construction of still another coating unit.
Figure 35:
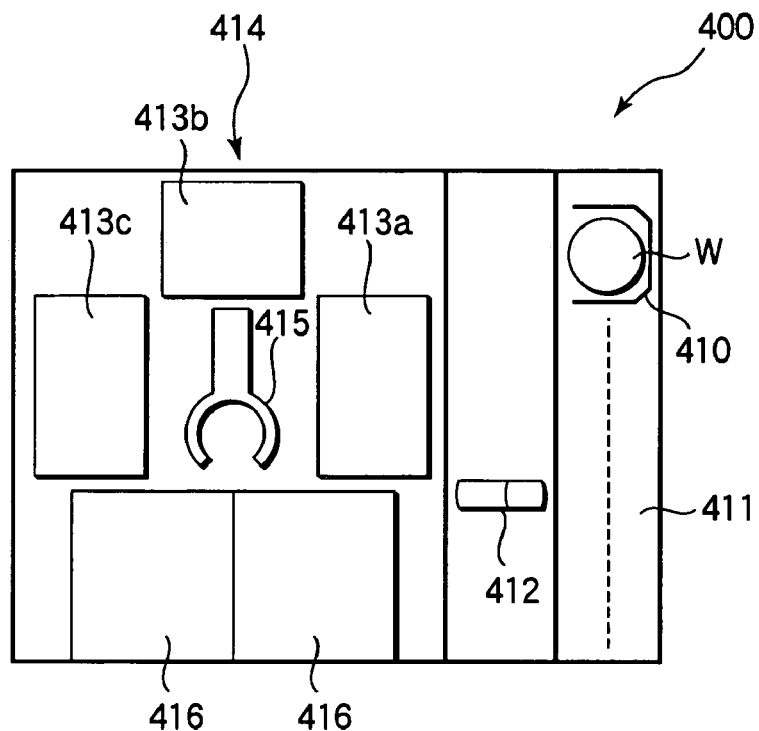
FIG. 35 is a plan view schematically showing the construction of a conventional SOD system.
Figure 36:
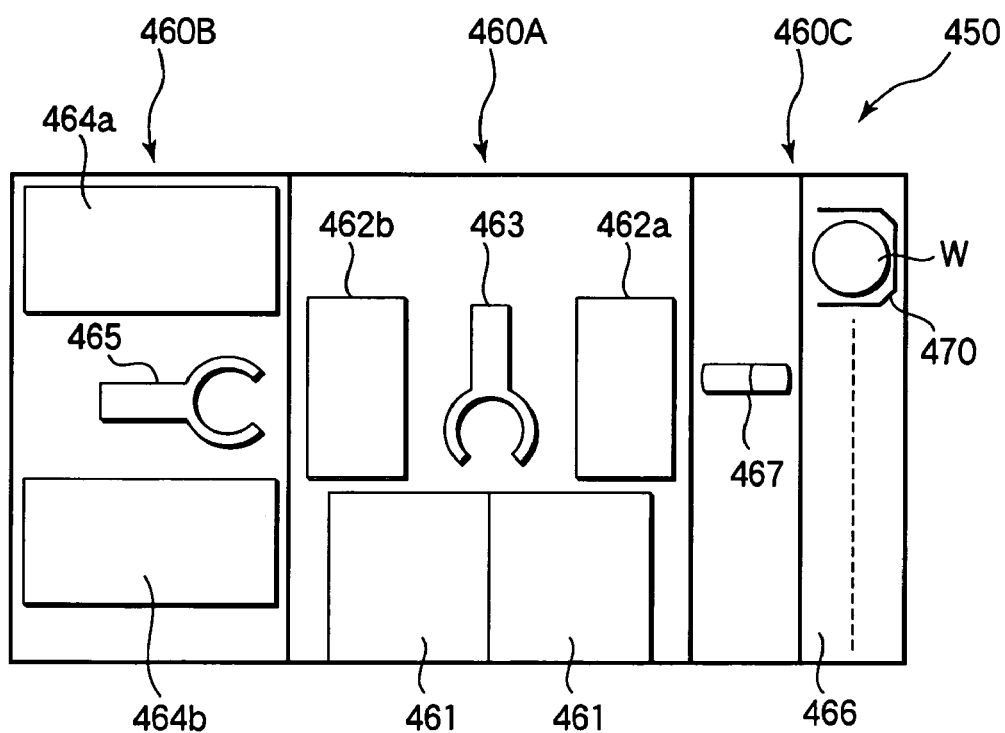
FIG. 36 is a plan view schematically showing the construction of another conventional SOD system.
Figure 37:
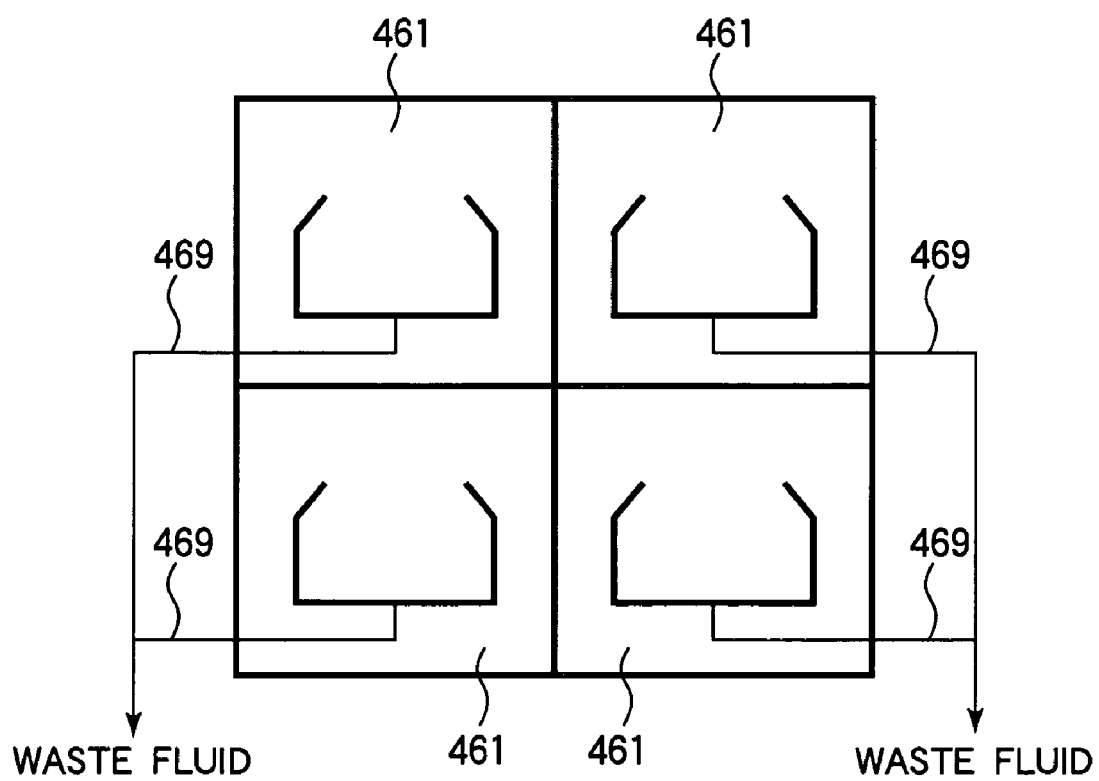
FIG. 37 schematically illustrates the arrangement of drain pipes for recovering the waste liquid in the conventional SOD system.

In the embodiments described above, the coating unit (SCT) 18 arranged within the process tower is constructed such that the pump 26 is arranged in the coater area 18A. However, the coating unit (SCT) is not limited to the particular construction. For example, FIG. 33 schematically shows the construction of another coating unit (SCT) 18'. In this case, the pump 26 is arranged within a tank area 18B' in a manner to be positioned sideward of the chemical liquid tank 29. Also, FIG. 34 schematically shows the construction of still another coating unit (SCT) 18". In this case, a tank area 18B" of the coating unit (SCT) 18" is divided into an upper stage and a lower stage. The chemical liquid tank 29 is arranged in the lower stage of the tank area 18B", and the pump 26 is arranged in the upper stage of the tank area 18B". The length of the liquid supply pipe arranged between the pump 26 and the supply nozzle 25 can be shortened in each of these coating units (SCT) 18' and 18", too.

The embodiments described above are directed to an apparatus for processing the wafer W. However, it is also possible to apply the technical idea of the present invention to an apparatus for processing a glass substrate used in, for example, a liquid crystal display. Also, the technical idea of the present invention can be applied to not only the formation of an insulating film by the SOD method but also to the formation of an SOG (Spin on Glass) film. The surface of the film formed by the CVD method is irregular. Therefore, a $SiO_2$ film is formed on the surface of the film formed by the CVD method so as to obtain a flat surface. The SOG film noted above denotes the $SiO_2$ noted above. The SOG film can be formed by forming a coating film of a chemical liquid on the wafer surface by the spin coating method, followed by applying a heat processing to the wafer, like the SOD method.

INDUSTRIAL APPLICABILITY

As described above, the present invention is adapted for application to the SOD system for forming an insulating film on various substrates such as a semiconductor wafer, though the application of the present invention is not limited to the particular SOD system. The present invention can also be applied widely to the apparatus for coating a substrate with a chemical liquid for forming a coating film, followed by applying a heat processing to the coating film. For example, the present invention can also be applied to the apparatus for forming a resist film.

The invention claimed is:

1. An insulating film-forming apparatus, comprising:
a substrate process section for forming an insulating film on the substrate;
a substrate transfer section for transferring the substrate from the outside into the substrate process section; and
a substrate transfer mechanism for transferring the substrate between the substrate process section and the substrate transfer section,
the substrate process section includes a process tower comprising plural process units stacked one above the other for performing a series of processes for forming an insulating film on the substrate, said plurality of process units including a coating unit for coating the substrate with a chemical liquid containing a material of the insulating film so as to form a coating film, a temperature control unit for controlling the substrate before coating with the chemical liquid at a prescribed temperature and a heating unit for heating the substrate having the coating film formed thereon,
the process tower is detachable from the substrate process section,
each of the plural process units is housed in a casing,
the process tower includes a housing which has a plurality of levels for detachably accommodating the casings of the process units,
the casing of the temperature control unit is isolated and sealed from the passage of air therethrough and is set in the housing at a level below the casing of the heating unit which also is isolated and sealed from the passage of air therethrough, and the casing of the coating unit is set in the housing at a level below the casing of the temperature control unit,
the casing of the heating unit, the casing of the temperature control unit and the casing of the coating unit are arranged with an air passageway interposed therebetween within the housing so as to achieve heat insulation therebetween,
an air blowing mechanism is connected to the coating unit and configured to blow air having a controlled temperature and humidity into the coating unit so as to control the temperature and humidity of the coating unit,
the casing of the coating unit is constructed to cause the air blown from the air blowing mechanism into the coating unit to be exhausted from the coating unit into the air passageway,
the air passageway is connected to an exhaust device through an exhaust port formed on the housing of the process tower and located above the casing of the heating unit, and
the insulating film-forming apparatus is designed such that the air blown from the air blowing mechanism is forced by the exhaust device to pass through the coating unit and flow upward into the air passageway, then flow upward through a portion of the air passageway around the casing of the temperature control unit and a portion of the air passageway around the casing of the heating unit, in this order, and then exhaust at the exhaust device.

2. The insulating film-forming apparatus according to claim 1, wherein:
the substrate transfer section includes a table on which is disposed a carrier housing a plurality of substrates;
the substrate process section includes a transfer unit on which the substrate is temporarily disposed; and
the substrate transfer mechanism includes: a first transfer device arranged in the substrate transfer section for transferring the substrate between the table and the transfer unit; and a second transfer device arranged in the substrate process section for transferring the substrate between the transfer unit and the plural process units.

3. The insulating film-forming apparatus according to claim 2, further comprising a curing unit arranged in a position adjacent to the substrate process section so as to permit the substrate to be transferred into and out of the curing unit by the second substrate transfer device, said curing unit serving to apply a curing processing to the insulating film after the heat processing applied by the heating unit.

4. The insulating film-forming apparatus according to claim 3, comprising a plurality of curing units, which are arranged in a position adjacent to the substrate process section and stacked one upon the other so as to form a tower.

5. The insulating film-forming apparatus according to claim 1, wherein the substrate process section includes a plurality of process towers.

6. The insulating film-forming apparatus according to claim 5, wherein each of the plural process towers includes a plurality of process units for forming an insulating film, the plural process towers forming the same kind of insulating film.

7. The insulating film-forming apparatus according to claim 5, wherein at least one of the plural process towers includes a plurality of process units for forming an insulating film differing in kind from the insulating film formed in another process tower.

8. The insulating film-forming apparatus according to claim 5, wherein a first insulating film is formed on the substrate in one of the plural process towers, and a second insulating film is formed on the first insulating film in another process tower.

9. The insulating film-forming apparatus according to claim 1, comprising a plurality of substrate process sections, wherein at least one substrate process section is detachable from the other substrate process sections.

10. The insulating film-forming apparatus according to claim 1, wherein the coating unit comprises:
a coating process section having a substrate holding mechanism for holding the substrate substantially horizontal, a chemical liquid supply nozzle for supplying a chemical liquid onto the substrate held by the substrate holding mechanism, and a cup surrounding the side surface of the substrate held by the substrate holding mechanism and equipped with a exhaust port of the chemical liquid formed at the bottom; and
a waste liquid recovery section arranged below the coating process section and having a waste liquid tank for storing the waste liquid exhausted from the exhaust port and with a waste liquid passageway for introducing the waste liquid exhausted from the exhaust port into the waste liquid tank.

11. The insulating film-forming apparatus according to claim 10, wherein: the waste liquid recovery section further comprises a chemical liquid tank storing the chemical liquid used in the coating process section; and the coating process section further comprises a pump for supplying the chemical liquid from the chemical liquid tank into the chemical liquid supply nozzle.

12. The insulating film-forming apparatus according to claim 10, wherein the waste liquid recovery section further comprises a chemical liquid tank storing the chemical liquid used in the coating process section, and a pump arranged sideward of the chemical liquid tank for supplying the chemical liquid from the chemical liquid tank into the chemical liquid supply nozzle.

13. The insulating film-forming apparatus according to claim 10, wherein the waste liquid recovery section further comprises a chemical liquid tank storing the chemical liquid used in the coating process section, and a pump arranged on the upper side of the chemical liquid tank for supplying the chemical liquid from the chemical liquid tank into the chemical liquid supply nozzle.

14. The insulating film-forming apparatus according to claim 1, wherein a casing containing a film thickness measuring unit configured to measure a thickness of the insulating film is set in the housing at a position between the casing of the coating unit and the casing of the temperature control unit, so as to achieve heat insulation therebetween.

15. The insulating film-forming apparatus according to claim 1, wherein the heating unit comprises a low temperature heating unit for drying the coating film and a baking unit for baking the coating film, in which the casing of the low temperature heating unit is set in the housing at a level below the casing of the baking unit with part of the air passageway interposed therebetween to achieve heat insulation therebetween.

16. An insulating film-forming apparatus comprising:
a process tower comprising a plurality of process units stacked one above the other for performing a series of processes for forming an insulating film on the substrate, said plurality of process units including a coating unit for coating a substrate with a coating liquid containing a material of an insulating film, a temperature control unit for controlling the substrate before coating with the coating liquid at a prescribed temperature and a heating unit for heating the substrate having the coating liquid applied thereon,
each of the plurality of process units is housed in a casing,
the process tower includes a housing which has a plurality of levels for detachably accommodating the casings of the process units,
the casing of the temperature control unit is isolated and sealed from the passage of air therethrough and is set in the housing at a level below the casing of the heating unit which also is isolated and sealed from the passage of air therethrough, and the casing of the coating unit is set in the housing at a level below the casing of the temperature control unit,
the casing of the heating unit, the casing of the temperature control unit and the casing of the coating unit are arranged with an air passageway interposed therebetween within the housing so as to achieve heat insulation therebetween,
an air blowing mechanism is connected to the coating unit and configured to blow air having a controlled temperature and humidity into the coating unit so as to control the temperature and humidity of the coating unit, the casing of the coating unit is constructed to cause the air blown from the air blowing mechanism into the coating unit to be exhausted from the coating unit into the air passageway, the air passageway is connected to an exhaust device through an exhaust port formed on the housing of the process tower and located above the casing of the heating unit, the insulating film-forming apparatus is designed such that the air blown from the air blowing mechanism is forced by the exhaust device to pass through the coating unit and flow upward into the air passageway, then flow upward through a portion of the air passageway around the casing of the temperature control unit and a portion of the air passageway around the casing of the heating unit, in this order, and then exhaust at the exhaust device, a waste liquid tank disposed below the coating unit, for storing waste liquid exhausted from the coating unit;

a substrate transfer section for transferring the substrate from outside;

a substrate transfer mechanism for transferring the substrate between the substrate transfer section and the process units of the process tower;

a coating liquid tank disposed below the coating unit, for storing the coating liquid; and a pump disposed below the coating unit or on a lateral side thereof, for supplying the coating liquid from the coating liquid tank into a supply nozzle, wherein the coating unit comprises a substrate holding mechanism for holding the substrate substantially horizontal, a nozzle for supplying a coating liquid onto the substrate, a cup for surrounding the substrate held by the substrate holding mechanism to prevent the coating liquid from being scattered outside, and a waste liquid passageway having an upper end connected to the cup and a lower end connected to the waste liquid tank and including no horizontal portion.

17. The insulating film-forming apparatus according to claim 16, wherein the process units include a curing unit disposed above the heating unit, for applying a curing process to the insulating film.

* * * * *